US012080345B2

(12) United States Patent
Kim

(10) Patent No.: US 12,080,345 B2
(45) Date of Patent: Sep. 3, 2024

(54) MEMORY DEVICE INCLUDING A PLURALITY OF STACKED MEMORY CELLS

(71) Applicant: SK hynix Inc., Icheon-si (KR)

(72) Inventor: Dong Keun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 310 days.

(21) Appl. No.: 17/402,291

(22) Filed: Aug. 13, 2021

(65) Prior Publication Data

US 2021/0375359 A1 Dec. 2, 2021

Related U.S. Application Data

(63) Continuation-in-part of application No. 17/087,080, filed on Nov. 2, 2020, now Pat. No. 11,094,378,
(Continued)

(30) Foreign Application Priority Data

Jun. 28, 2021 (KR) ........................ 10-2021-0083984

(51) Int. Cl.
G11C 13/00 (2006.01)
G11C 11/16 (2006.01)
(Continued)

(52) U.S. Cl.
CPC ........ *G11C 13/0004* (2013.01); *G11C 11/161* (2013.01); *G11C 13/0007* (2013.01);
(Continued)

(58) Field of Classification Search
CPC ............ G11C 13/0004; G11C 13/0007; G11C 13/0026; G11C 13/0028; G11C 13/003
See application file for complete search history.

(56) References Cited

U.S. PATENT DOCUMENTS 8,004,873 B2 * 8/2011 Toda .................. G11C 13/0002
365/158
8,848,424 B2 9/2014 Ikeda et al.
(Continued)

FOREIGN PATENT DOCUMENTS

CN 103633108 A 3/2014
CN 104123957 A 10/2014
(Continued)

Primary Examiner — Alfredo Bermudez Lozada
(74) Attorney, Agent, or Firm — WILLIAM PARK & ASSOCIATES LTD.

(57) ABSTRACT

A memory device may include a bank layer and a control circuit layer. The bank layer may be arranged on a semiconductor substrate. The bank layer may include a plurality of mats. Each of the mats may include a plurality of stacked decks. Each of the decks may include a plurality of memory cells. The control circuit layer may be arranged between the semiconductor substrate and the bank layer. The control circuit layer may include a plurality of control circuit regions corresponding to the mats, respectively. The stacked decks may include a plurality of stacked word lines and a plurality of stacked bit lines intersected with the stacked word lines. A word line decoder, for controlling the word lines, and a bit line decoder, for controlling the bit lines, may be alternately and repeatedly arranged in the control circuit layer.

19 Claims, 17 Drawing Sheets

Related U.S. Application Data which is a continuation of application No. 16/582,861, filed on Sep. 25, 2019, now Pat. No. 10,825,515.

(51) Int. Cl.
| | |
|---|---|
| *H10B 63/00* | (2023.01) |
| *H10N 50/85* | (2023.01) |
| *H10N 70/00* | (2023.01) |
| *H10N 70/20* | (2023.01) |

(52) U.S. Cl.
CPC ...... *G11C 13/0026* (2013.01); *G11C 13/0028* (2013.01); *G11C 13/003* (2013.01); *G11C 2213/71* (2013.01); *G11C 2213/72* (2013.01); *G11C 2213/79* (2013.01); *H10B 63/24* (2023.02); *H10N 50/85* (2023.02); *H10N 70/231* (2023.02); *H10N 70/826* (2023.02); *H10N 70/8413* (2023.02); *H10N 70/8828* (2023.02)

(56) References Cited

U.S. PATENT DOCUMENTS

| | | | |
|---|---|---|---|
| 9,361,974 | B2 | 6/2016 | Lee et al. |
| 9,455,257 | B2* | 9/2016 | Murooka ............... H10B 99/00 |
| 9,627,009 | B2 | 4/2017 | Petti |
| 10,037,801 | B2 | 7/2018 | Sekar et al. |
| 10,600,452 | B2 | 3/2020 | Castro et al. |
| 2016/0049197 | A1 | 2/2016 | Park et al. |
| 2016/0093376 | A1 | 3/2016 | Lee et al. |
| 2017/0117328 | A1 | 4/2017 | Terai |
| 2019/0172502 | A1* | 6/2019 | Jeong ..................... G11C 5/025 |

FOREIGN PATENT DOCUMENTS

| | | |
|---|---|---|
| CN | 104701454 A | 6/2015 |
| CN | 105895152 A | 8/2016 |
| CN | 108091361 A | 5/2018 |
| KR | 1020170097811 A | 8/2017 |
| KR | 1020170128989 A | 11/2017 |
| KR | 1020190064960 A | 6/2019 |

\* cited by examiner

FIG. 14

MEMORY DEVICE INCLUDING A PLURALITY OF STACKED MEMORY CELLS

CROSS-REFERENCES TO RELATED APPLICATION

This application is a continuation-in-part of U.S. patent application Ser. No. 17/087,080, filed on Nov. 2, 2020, titled "Resistance variable Memory Device Including Stacked memory cells" which is a continuation of U.S. patent application Ser. No. 16/582,861 filed on Sep. 25, 2019. This application claims priority under 35 U.S.C. 119(a) to Korean Application No. 10-2021-0083984, filed on Jun. 28, 2021, which are incorporated herein by references in their entirety.

BACKGROUND

1. Technical Field

Various embodiments may generally relate to a memory device, more particularly, to a memory device including a plurality of stacked memory cells.

2. Related Art

In order to provide a memory device with high capacity and low power consumption, non-volatile type next generation memory devices without a periodical refresh may have been studied. The next generation memory devices may require a high integration and a rapid speed.

A resistive memory device as the next generation memory device may include a phase changeable RAM (PCRAM), a nano floating gate memory (NFGM), a polymer RAM (PoRAM), a magnetic RAM (MRAM), a ferroelectric RAM (FeRAM), a resistive RAM (ReRAM), etc.

The PCRAM among the above devices may include a storage element arranged at an intersected portion of a word line and a bit line. Such a memory cell array is called a cross point array structure. The cross point cell array structure may include at least two stacked memory cell arrays.

SUMMARY

In an example of an embodiment of the present disclosure, a memory device may include a bank layer and a control circuit layer. The bank layer may be arranged on a semiconductor substrate. The bank layer may include a plurality of mats. Each of the mats may include a plurality of stacked decks. Each of the decks may include a plurality of memory cells. The control circuit layer may be arranged between the semiconductor substrate and the bank layer. The control circuit layer may include a plurality of control circuit regions corresponding to the mats, respectively. The stacked decks may include a plurality of stacked word lines and a plurality of stacked bit lines intersected with the stacked word lines. A word line decoder and a bit line decoder may be alternately arranged in the control circuit layer.

In an example of an embodiment of the present disclosure, a memory device may include a control circuit layer and a bank layer. The control circuit layer may include a plurality of control circuit regions. The control circuit regions may be arranged on a semiconductor substrate along a first direction and a second direction substantially perpendicular to the first direction to have a matrix shape. The bank layer may be arranged over the control circuit layer. The bank layer may include a plurality of memory cells. The memory cells may include a plurality of first electrode lines, a plurality of second electrode lines intersected with the first electrode lines, and a resistor pattern arranged at intersected points between the first electrode lines and the second electrode lines. The control circuit regions may include a plurality of first control circuit regions in which a first electrode line selector for selecting the first electrode lines may be positioned, and a plurality of second control circuit regions in which a second electrode line selector for selecting the second electrode lines may be positioned. The first control circuit regions and the second control circuit regions may be alternately arranged along the first direction and the second direction.

BRIEF DESCRIPTION OF THE DRAWINGS

The above and other aspects, features and advantages of the subject matter of the present disclosure will be more clearly understood from the following detailed description taken in conjunction with the accompanying drawings, in which:

FIG. 14 is an enlarged cross-sectional view illustrating a memory device cut in a direction parallel to a bit line in accordance with an example of an embodiment;

DETAILED DESCRIPTION

Various embodiments will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the embodiments as defined in the appended claims.

The present embodiments are described herein with reference to cross-section and/or plan illustrations of idealized embodiments. However, embodiments should not be construed as limiting the concepts. Although a few embodiments will be shown and described, it will be appreciated by those of ordinary skill in the art that changes may be made in these embodiments without departing from the principles and spirit of the disclosure.

Figure 1:
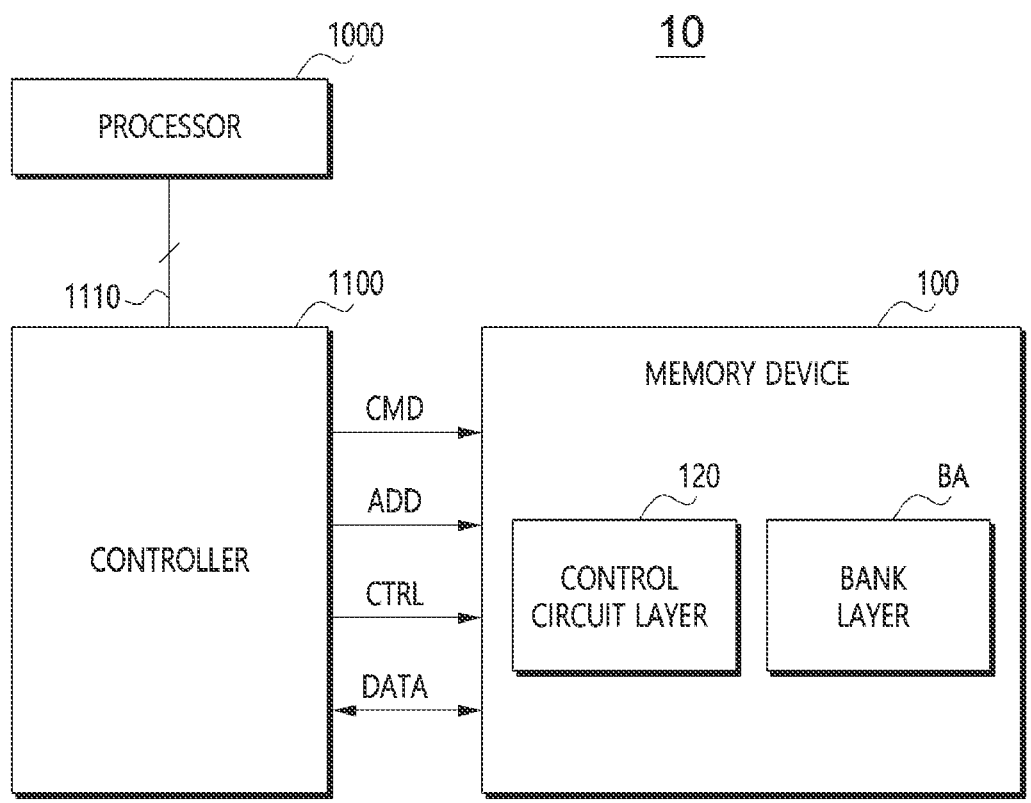
FIG. 1 is a block diagram illustrating a semiconductor system in accordance with an example of an embodiment.

FIG. 1 is a block diagram illustrating a semiconductor system in accordance with an example of an embodiment.

Referring to FIG. 1, a semiconductor system 10 may include a processor 1000, a controller 1100 and a memory device 100.

The processor 1000 may be interfaced with the controller 1100 via a bus 1110. The processor 1000 may provide the controller 1100 with a memory access request (a read request, a write request, etc.,) including a memory address and data. The processor 1000 may receive read data from the controller 1100.

The controller 1100 may provide the memory device 100 with a command CMD such as a read command, a write command, etc., an address ADD, data DATA and a control command CTRL for operating the memory device 100.

The memory device 100 may include a non-volatile memory device. In an example of an embodiment, the memory device 100 may include a resistive memory device, not limited thereto. For example, the memory device may 100 include a bank layer BA and a control circuit layer 120.

Figure 2:
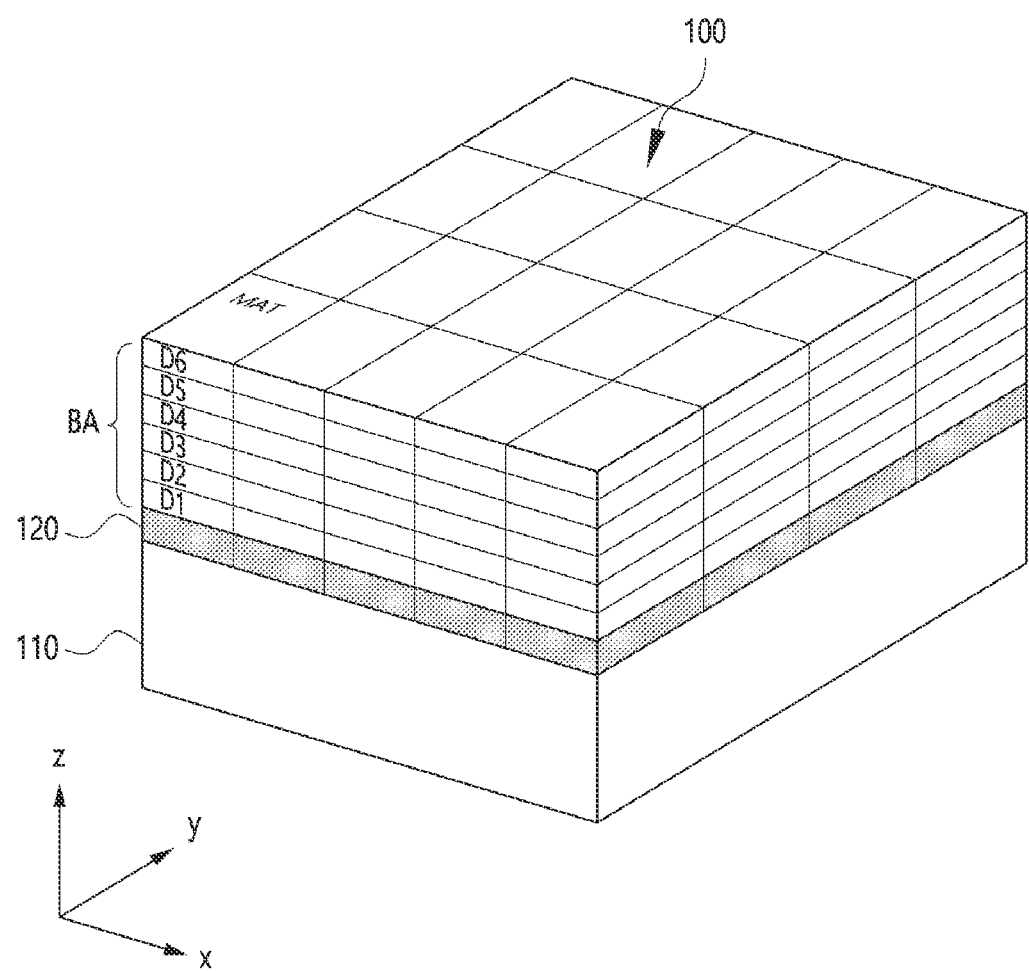
FIG. 2 is a perspective view illustrating a memory device in accordance with an example of an embodiment.

FIG. 2 is a perspective view illustrating a memory device in accordance with an example of an embodiment.

Referring to FIG. 2, the memory device 100 may include a semiconductor substrate 110, a control circuit layer 120 and a bank layer BA. In an embodiment, the memory device 100 may be for example but not limited to a resistive memory device 100. In an embodiment, the memory device 100 may be for example but not limited to a variable resistive memory device 100.

The semiconductor substrate 110 may include a semiconductor material such as silicon, gallium arsenide (GaAs), etc. However, the semiconductor substrate 110 may include a silicon on insulator (SOI) substrate, a compound semiconductor substrate, etc.

The control circuit layer 120 may be formed on the semiconductor substrate 110. The control circuit layer 120 may include various circuits to control memory operations of the bank layer BA. The control circuit layer 120 may generate various control signals for driving a memory cell in the bank layer BA using the commands input from the controller 1100. For example, the control circuits in the control circuit layer 120 may include a word line decoder, a bit line decoder, a voltage generation circuit, a sense amplifier, etc.

Figure 3:
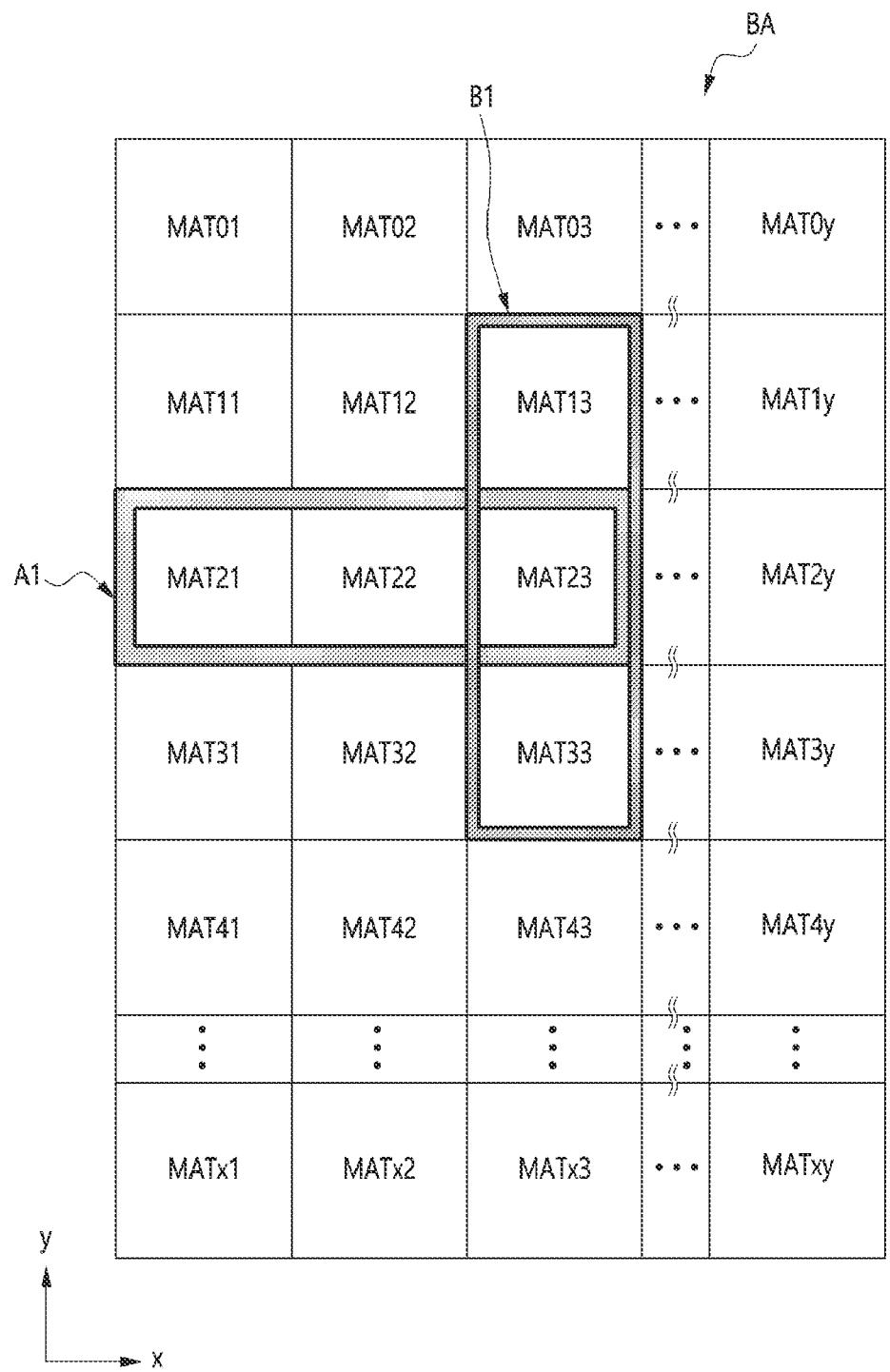
FIG. 3 is a plan view illustrating a bank in accordance with an example of an embodiment.

The bank layer BA may include a plurality of banks. The accompanying drawings may show a part of the banks. As shown in FIG. 3, each of the banks may be divided into a plurality of mats MAT arranged in a matrix shape. For example, the mat MAT may be called a memory cell array.

The mat MAT may include a plurality of word lines and a plurality of bit lines extended without disconnection. A general mat may he defined as a memory cell group controlled by a group of control circuits (hereinafter, a control circuit group). Currently, the control circuit group may be arranged between two adjacent mats to control the two adjacent mats by considering the layout efficiency. Thus, the word line without the disconnection may extend to pass through the two adjacent mats in a x-direction and a bit line without the disconnection may extend to pass through the two adjacent mats in a y-direction.

Further, the mat MAT may include a plurality of resistor patterns arranged at each of intersected portions between the word lines and the bit lines, as a memory element. In this embodiment, the memory cells may be formed to have a cross point array type. Further, the memory cells in the mat MAT may be vertically stacked. The memory cells on a same level may be referred to as a deck D. The mat MAT or the bank layer BA may include at least five decks, for example, a six decks D1~D6. In order to form the decks D1~D6, the word lines and the hit lines may be alternately stacked in a row direction and a column direction.

For example, the mat MAT may be referred to as a tile. Alternatively, the tile disclosed in U.S. application Ser. Nos. 16/582,861 and 17/087,080 may correspond to a part of the mat MAT, i.e., a sub-mat. U.S. application Ser. Nos. 16/582, 861 and 17/087,080 may be incorporated herein by reference in its entirety.

Figure 4:
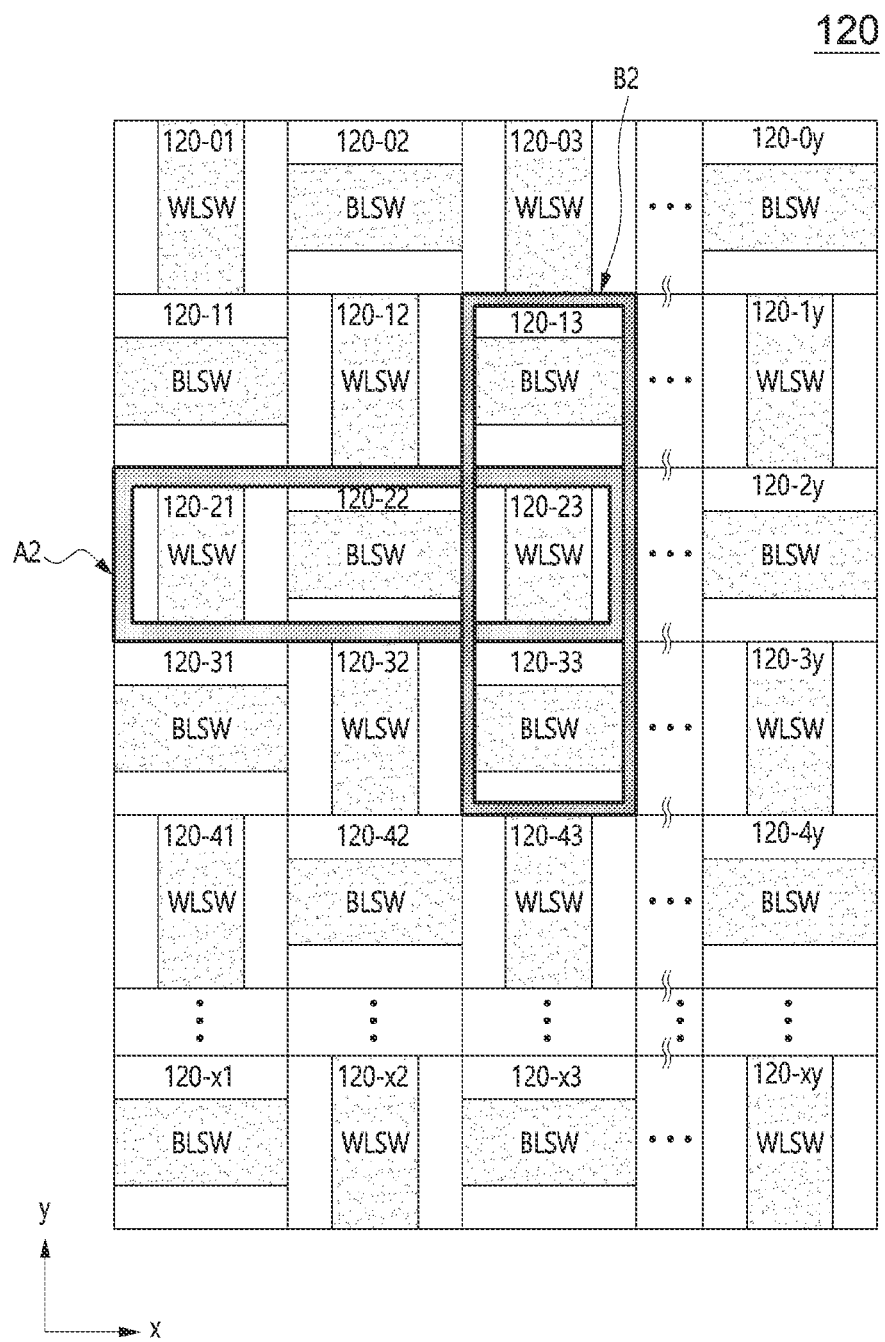
FIG. 4 is a plan view illustrating a control circuit layer in accordance with an example of an embodiment.

FIG. 4 is a plan view illustrating a control circuit layer in accordance with an example of an embodiment.

Referring to FIG. 4, the control circuit layer 120 may be arranged under the bank layer BA. The control circuit layer 120 may be classified into a plurality of control circuit regions 120-01~120-xy corresponding to the mats MAT01~MATxy. For example, the first mat MAT01 may be positioned over the first control circuit region 120-01. As used herein, the tilde "~" indicates a range of components. For example, "120-01~120-xy" indicates the control is circuit regions 120-01, 120-02, . . . , and 120-xy shown in FIG. 4.

Each of the control circuit regions 120-01~120-xy may include various control circuit element. For conveniences of explanations, the drawings may show only the word line decoder WLSW and the bit line decoder BLSW for selecting the memory cell.

In an example of an embodiment, the word line decoder WLSW and the bit line decoder BLSW may be alternately arranged in the control circuit regions 120-01~120-xy arranged in an x-direction and a y-direction. In an embodiment, a word line decoder WLSW for controlling the stacked word lines and a bit line decoder BLSW for controlling the stacked bit lines are respectively located in the control circuit regions control circuit regions 120-01~120-xy) and the word line decoder WLSW and bit line decoder BLSW are alternately arranged in the control circuit layer 120 along a word line extension direction and a bit line extension direction. The word line extension direction may he the x-direction or a row direction. The bit line extension direction may be the y-direction or a column direction.

For example, when the word line decoder WLSW is arranged in the 12th control circuit region 120-12, the bit line decoder BLSW may be arranged in the 2nd control circuit region 120-02, the 11th control circuit region 120-11, the 13th control circuit region 120-13 and the 22nd control circuit region 120-22 adjacent to the 12th control circuit region 120-12. When the bit line decoder BLSW is arranged in the 13th control circuit region 120-13, the word line decoder WLSW may be arranged in the 3rd control circuit region 120-03, the 12th control circuit region 120-12, the 14th control circuit region 120-14 and the 23rd control circuit region 120-23 adjacent to the 13th control circuit region 120-13.

In an example of an embodiment, each of the plurality of word line selection switches constituting the word line decoder WLSW is arranged on each of rows in the mat MAT. For example, the row (or row region) may be defined as a region where one word line may be arranged when the mat MAT includes one deck. Meanwhile, when the mat MAT is configured by stacking the plurality of decks D1~D6, the plurality of word lines may be stacked on the row. The word lines stacked on the row may be separated into a pair of word line stack structures by the word line decoder WLSW. For example, the word line stack structure may be corresponded to a unit word line stack structure or an individual word line stack structure. Thus, the unit word line stack structure may have a length between a pair of the adjacent word line decoders in the x-direction. For example, the word line selection switch may be interpreted as a first electrode line selector.

Further, the bit line decoder BLSW may include bit line selection switches formed at each of columns in the mat MAT. The column (or column region) may be defined as a region where one bit line may be arranged when the mat MAT include one deck. Meanwhile, when the mat MAT is configured by stacking the plurality of decks D1~D6, the plurality of bit lines may be stacked on the column. For example, the bit lines stacked on the column may be separated into a pair of bit line stack structures by the bit line decoder BLSW. For example, the bit line selection switch may be interpreted as a second electrode line selector.

Figure 5:
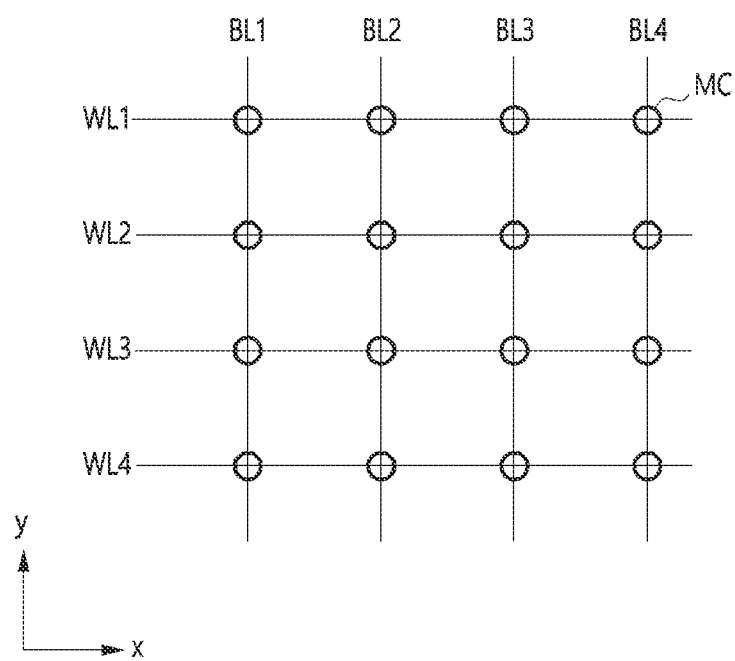
FIG. 5 is a view illustrating a mat in accordance with an example of an embodiment.

FIG. 5 is a view illustrating a mat in accordance with an example of an embodiment.

Referring to FIG. 5, each deck of the mat MAT may include the word lines WL1~WL4 and the bit lines BL1~BL4. For example, the word lines WL1~WL4 may correspond to first electrode lines and the bit lines BL1~BL4 may correspond to second electrode lines. The word lines WL1~WL4 and the bit lines BL1~BL4 may be intersected with each other. Memory cells MC may be formed at intersected portions between the word lines WL1~WL4 and the bit lines BL1~BL4. Each of the memory cells MC may include the word line WL, the bit line BL and the resistor pattern arranged between the word line WL and the bit line BL. In an example of an embodiment, the four word lines and the four bit lines may be shown for example. However, hundreds of the word lines and hundreds of the bit lines may be arranged in one mat MAT.

The word lines WL1~WL4 may be arranged along the x-direction (or a row direction) by a uniform gap, in parallel. The bit lines BL1~BL4 may be arranged along the y-direction (a column direction) by a uniform gap, in parallel.

The word lines WL1~WL4 and the bit lines BL1~BL4 in the mat MAT may be alternately stacked to form a plurality of stack decks Ds. Further, the resistor patterns may be arranged at is intersected portions between the word lines WL1~WL4 and the bit lines BL1~BL4.

Hereinafter, the word lines, which may be overlapped with each other to have substantially the same length and formed on the same row, may be referred to as the word line stack structure. Further, the bit lines, which may be overlapped with each other to have substantially the same length and formed on the same column, may be referred to as a bit line stack structure.

Figure 6A:
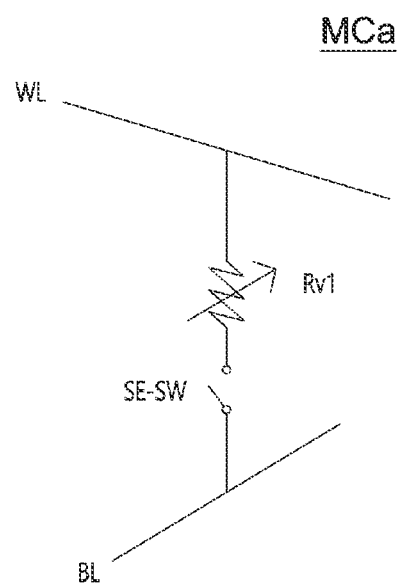
FIGS. 6A and 6B are equivalent circuit diagrams illustrating a memory cell in accordance with an example of an embodiment.
Figure 6B:
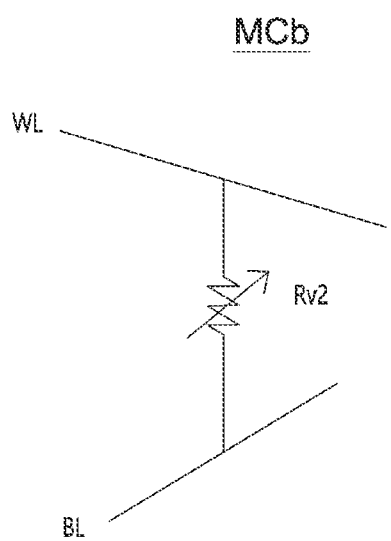

FIGS. 6A and 6B are equivalent circuit diagrams illustrating a memory cell in accordance with an example of an embodiment.

Referring to FIG. 6A, a memory cell MCa may include a bit line BL, a word line WL, a selection element SE-SW and a variable resistor Rv1 connected between the bit line BL and the word line WL. For example, the selection element SE-SW may include a diode, a MOS transistor, etc.

The variable resistor Rv1 may correspond to the resistor pattern. The variable resistor Rv1 may include a chalcogenide compound, a transition metal compound, ferroelectrics, a ferromagnetism, etc., not limited thereto. Particularly, the variable resistor Rv1 may include metal oxide. The metal oxide may include transition metal oxide such as nickel oxide, titanium oxide, hafnium oxide, zirconium oxide, tungsten oxide, cobalt oxide, etc., Pevroskite material such as STO (SrTiO), PCMO (PrCaMnO), etc. Further, the variable resistor Rv1 may include a phase changeable material. The phase changeable material may include a chalcogenide material such as GST(Ge—Sb—Te). The variable resistor may be stabilized into any one of a crystalline state and an amorphous state by a heat (or voltage, current) to represent a switching characteristic between different resistance states. The variable resistor Rv1 may include a tunnel barrier layer between two magnetic layers. The magnetic layers may include NiFeCo, CoFe, etc. The tunnel barrier layer may include $Al_2O_3$, etc. The variable resistor Rv1 may represent a switching characteristic between different resistance states in accordance with magnetization directions of the magnetic layers. For example, when the magnetization directions of the magnetic layers may be parallel to each other, the variable resistor Rv1 may have a low resistor state. In contrast, when the magnetization directions of the magnetic layers might not be parallel to each other, the variable resistor Rv1 may have a high resistor state.

For example, when a selecting voltage may be applied to the word line WL and a set voltage or a reset voltage may be applied to the bit line intersected with the word line WL, a set current or a reset current may be applied to the variable resistor Rv1. Thus, a resistance of the variable resistor Rv1 may be changed to perform a memory operation.

Referring to FIG. 6B, a memory cell MCb may include a bit line BL, a word line WL and a variable resistor Rv2. When a voltage difference between the bit line BL and the word line WL may be greater than a threshold voltage Vth, a current may flow through the variable resistor Rv2 to change a resistance of the variable resistor Rv2. The resistance may be changed into a set state or a reset state by the current applied to the variable resistor Rv2.

The variable resistor Rv2 having the switching function may include an OTS (Ovonic threshold switch) layer as a resistor pattern. The OTS layer may include a composition in the chalcogenide materials used for the storage layer 38. For example, the OTS layer may include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, Ge—As—Bi—Se, etc.

Figure 7:
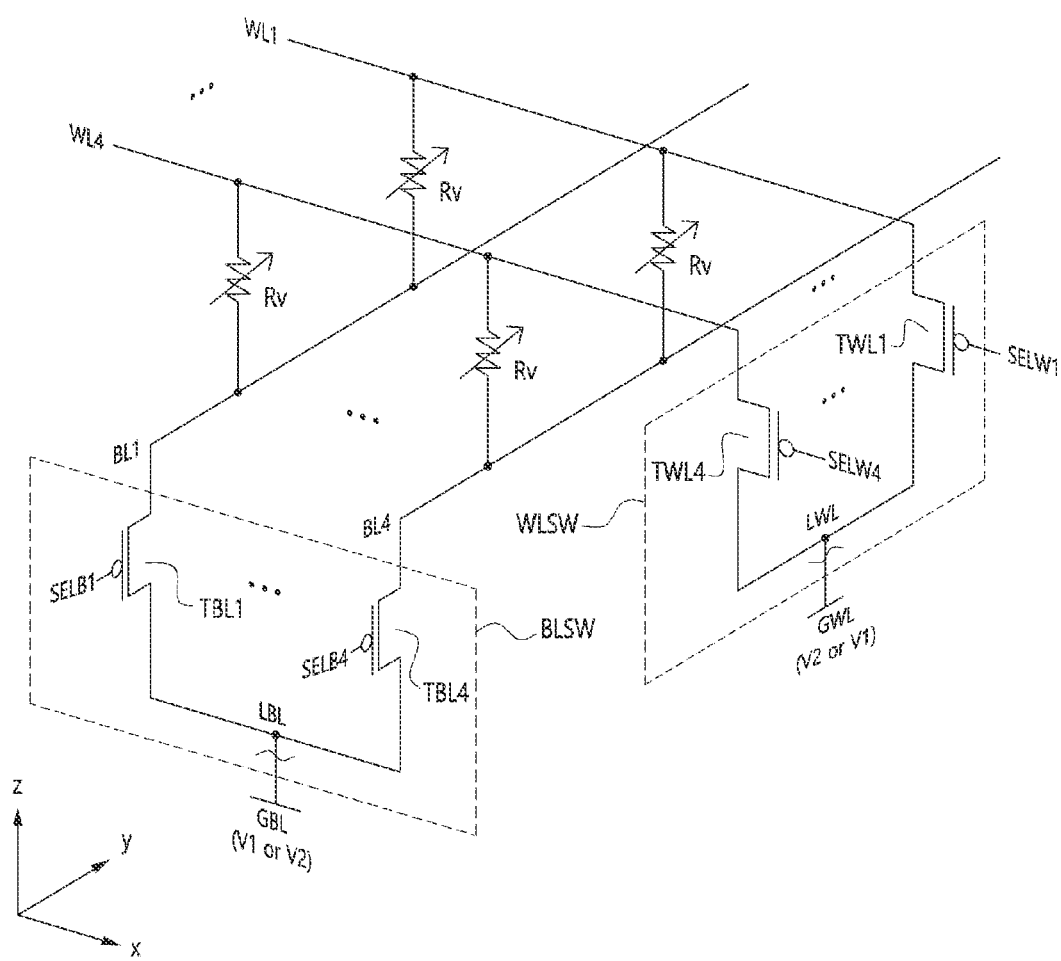
FIG. 7 is a circuit diagram illustrating a principle of selecting a memory cell in accordance with an example of an is embodiment.

FIG. 7 is a circuit diagram illustrating a selection principle of the memory cell in accordance with an example of an embodiment.

Before explaining the selection principle of the memory cell, a connection relationship between the word line WL and the bit line BL will be briefly described, as follows. The word line WL and the bit line BL may be configured to have a hierarchical structure. In the hierarchical structure, a global word line GWL may be connected to a plurality of local word lines LWL. Each of the local word lines LWL may be connected to a plurality of word lines WL1-WL4.

A global bit line GBL may be connected to a plurality of local bit lines LBL. Each of the local bit lines LBL may be connected to a plurality of bit lines BL.

Word line decoders WLSW and bit line decoders BLSW may select any one of the word lines WL and any one of the bit lines BL, respectively.

The global bit line GBL and the global word line GWL may selectively receive a first voltage V1 (or a second voltage V2) and the second voltage V2 (or the first voltage V1). A voltage difference between the first voltage V1 and the second voltage V2 may be capable of changing crystal properties of the variable resistor Rv. For example, a set voltage, a reset voltage, a read voltage and an erase voltage may be determined by the voltage difference of the first voltage V1 and the second voltage V2.

A global word line selection switch (not shown) may be connected between the global word line GWL and the local word lines. The global word line selection switch (not shown) may select a specific local word line LWL in response to a global word line selection signal (not shown).

A global bit line selection switch (not shown) may be connected between the global bit line GBL and the local bit lines LBL. The global bit line selection switch (not shown) may select a specific local bit line LBL in response to a global bit line selection signal (not shown).

A plurality of local word line selection switches TWL1~TWL4 (hereinafter, word line selection switches) may be connected between the specific local word line LWL and the word lines WL1~WL4. A plurality of local bit line selection switches TBL1~TBL4 (hereinafter, bit line selection switches) may be connected between the specific local bit line LBL and the bit lines BL1~BL4. In an example of an embodiment, a hierarchical structure between the global bit line GBL and the local bit lines LBL, and between the global word line GWL and the local word lines LWL may be well known to persons in the skilled in the art, any further illustrations with respect to the hierarchical structures may be omitted herein for brevity. In an example of an embodiment, the four bit line selection switches TBL1~TBL4 and the four word line selection switches TWL1~TWL4 may be connected, for example, to the global bit line GBL and the global word line GWL.

In an example of an embodiment, an array of the word line selection switches TWL1~TWL4 and the global word line selection switches (not shown) will be referred to as the word line decoder WLSW (refer to FIG. 4) and an array of the bit line selection switches TBL1~TBL4 and the global bit line selection switches (not shown) will be referred to as the bit line decoder BLSW (refer to FIG. 4). Further, the word line decoder WLSW and the bit line decoder BLSW may be included in a decoding circuit (not shown) of the control circuit layer 120.

The decoding circuit may further include an enabling circuit (not shown) for generating global word line selection signals and global bit line selection signals. Further, the enabling circuit (not shown) may generate word line selection signals SELW1~SELW4 for enabling any one of the word line selection switches TWL1~TWL4 and bit line selection signals SELB1~SELB4 for enabling any one of the bit line selection switches TBL1~TBL4. The global word line selection signals (not shown), the global bit line selection signals (not shown), the word line selection signals SELW1~SELW4 and the bit line selection signals SELB1~SELB4 may be generated by an address ADD provided from the controller 1100.

When one of the bit line selection switches TBL1~TBL4 and one of the word line selection switches TWL1~TWL4 is turned-on by the enabled bit line selection signal and the enabled word line selection signal, the first voltage V1 and the second voltage V2 may be transmitted to a selected bit line BL and a selected word line WL. Thus, a resistance of the resistor Rv between the selected bit line BL and the selected word line WL is changed by the voltage difference between the first voltage V1 and the second voltage V2. A memory cell MC including the selected bit line BL, the selected word line WL and the resistor Rv between the selected bit line BL and the selected word line WL may be performed the memory operation.

In an example of an embodiment, the bit line selection switches TBL1~TBL4 may include PMOS transistors and the global bit line selection switch may also include a PMOS transistor. In contrast, the word line selection switches TWL1~TWL4 may include NMOS transistors and the global word line selection switch may also include an NMOS transistor.

As will be described later, the word line decoder WLSW and the bit line decoder BLSW may be arranged at central portions of each of the control circuit regions 120-01~120-xy (refer to FIG. 4).

Figure 8A:
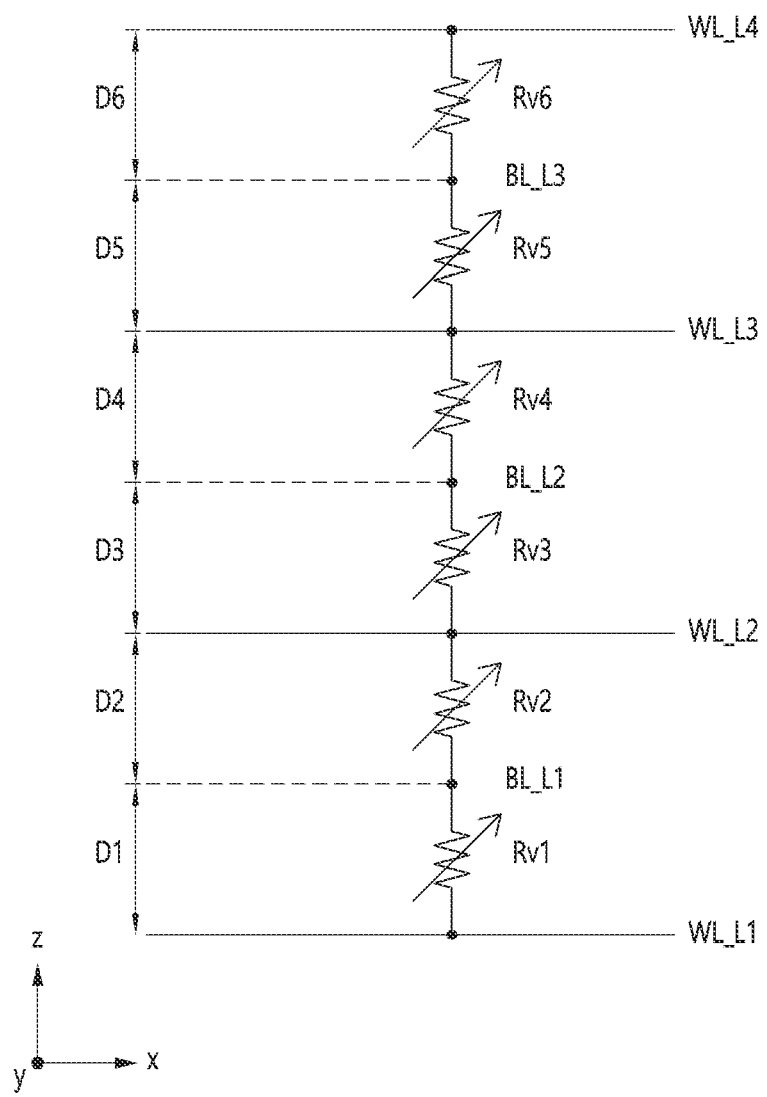
FIGS. 8A and 8B are circuit diagrams a relation between a word line and a bit line for embodying six decks in accordance with an example of an embodiment.
Figure 8B:
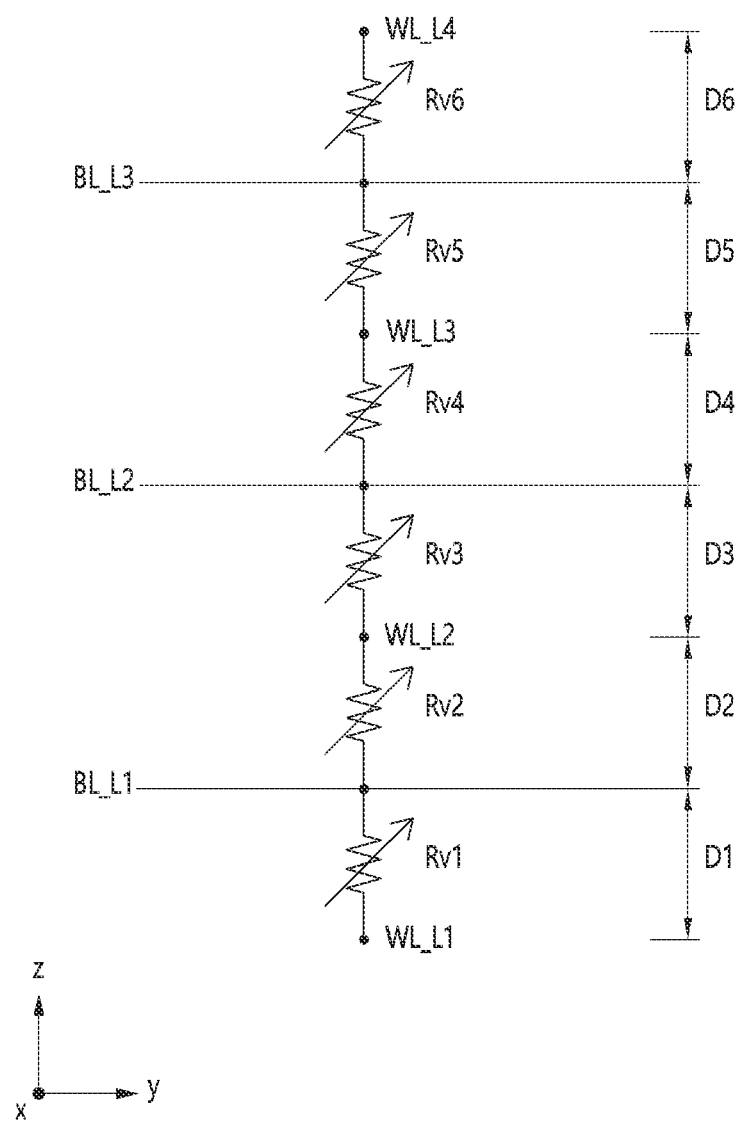

FIGS. 8A and 8B are circuit diagrams a relation between a word line and a bit line for embodying six decks in accordance with an example of an embodiment. The circuit diagram in FIG. 8A may be depicted viewed from a point parallel to the word line. The circuit diagram in FIG. 8B may be depicted viewed from a point parallel to the bit line.

Referring to FIGS. 8A and 8B, six decks D1~D6 may include first level to fourth level of word lines WL_L1~WL_L4 and first level to third level of bit lines BL_L1~BL_L3.

The first level to fourth level of the word lines WL_L1~WL_L4 may be extended in an x-direction and stacked in a z-direction. The first level to third level of the bit lines BL_L1~L3 may be extended in a y-direction and stacked in the z-direction.

The first level of the bit line BL_L1 may be arranged between the first level of the word line WL_L1 and the second level of the word line WL_L2. A first variable resistor pattern Rv1 may be interposed between the first level of the word line WL_L1 and the first level of the bit line BL_L1 to form the first deck D1. A second variable resistor pattern Rv2 may be interposed between the first level of the bit line BL_L1 and the second level of the word line WL_L2 to form the second deck D2. The second level of the bit line BL_L2 may be arranged between the second level of the word line WL_L2 and the third level of the word line WL_L3. A third variable resistor pattern Rv3 may be interposed between the second level of the word line WL_L2 and the second level of the bit line BL_L2 to form the third deck D3.

The word line and the bit line may be alternately stacked in the above-mentioned manner. The resistor patterns Rv1~Rv6 may be interposed between intersected portions of the word lines WL_L1~WL_L4 and the bit lines BL_L1~BL_L3 to form the at least five, for example, six stacked decks D1~D6. Particularly, the word lines WL_L2 and WL_L3 except for the first level of the word line WL_L1 corresponding to a lowermost word line and the fourth level of the word line WL_L4 corresponding to an uppermost word line and the bit lines BL_L1~BL_L3 may be shared by adjacent stack decks in common.

For example, the first level of the bit line BL_L1 may be commonly used as the bit line of the first deck D1 and the second deck D2. The second level of the word line WL_L2 may be commonly used as the word line of the second deck D2 and the third deck D3. Because the word line and the bit line may be applied to the two decks in common, the four stacked word lines and the three stacked bit lines may be required to form the six decks D1~D6.

In FIG. 8A and FIG. 8B, for conveniences of explanations, one deck D is shown to include one variable resistor Rv, not be limited thereto. For example, the one deck may include a plurality of the variable resistors Rv.

Figure 9:
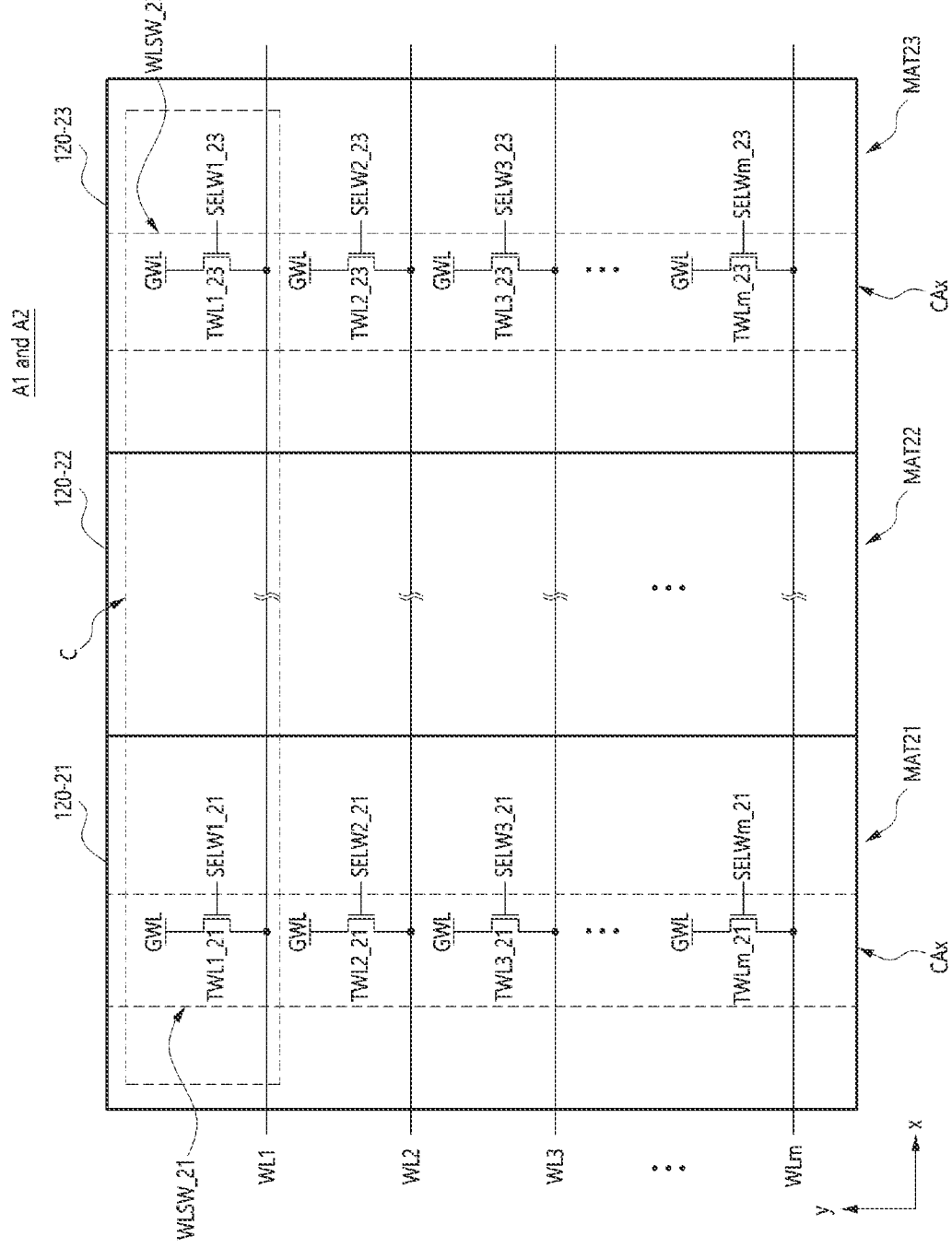
FIG. 9 is a view illustrating a connection relation between a word line in a plurality of mats and a word line decoder in a control circuit region in accordance with an example of an embodiment.

FIG. 9 is a view illustrating a connection relation between a word line in a plurality of mats and a word line decoder in a control circuit region in accordance with an example of an embodiment. A portion of the mat corresponding to "A1" in FIG. 3 may be actually positioned on a plane different from a plane on which the control circuit region corresponding to "A2" in FIG. 4 may be positioned. For conveniences of explanations, FIG. 9 may depict the portion of the mat and the control circuit region on a same plane. Further, the bit line decoder BLSW and the bit lines BL1~BLn might not be depicted in FIG. 9. FIG. 9 may show the 21st to 23rd mats MAT21~MAT23 and the 21st to 23rd control circuit regions 120-21~120-23 in FIGS. 3 and 4.

Referring to FIG. 9, the word line decoder WLSW may be arranged in the control circuit regions 120-21 and 120-23 under the 21st mat MAT21 and the 23rd mat MAT23, respectively. The word line decoder WLSW may be arranged at a first central portion CAx of the 21st control circuit region 120-21 and the 23rd control circuit region 120-23, respectively. The first central portion CAx may correspond to central portions of an x-axis direction of the 21st and 23rd control circuit regions 120-21 and 120-23. The word line decoder WLSW may include word line selection switches TWL1~TWLm positioned at rows.

As above, a plurality of word lines may be stacked in one row. Each of the word lines WL1~WLm may include stacked word lines. Each of the word lines WL1~WLm may be arranged between the word line decoders WLSW_21 and WLSW_23. Hereinafter, the stacked plurality of word lines positioned between the adjacent word line decoders WLSW_21 and WLSW_23 and positioned in one row will be referred to as a word line stack structure.

The stacked word lines in the word line stack structures may be connected to any one of the 21st and 23rd word line decoders WLSW_21 and WLSW_23. The connection structure between the word line and the word line decoder may be illustrated later.

As mentioned above, the word line selection switches TWL1~TWLm in the 21st and 23rd control circuit regions 120-21 and 120-23 may include NMOS transistors turned-on in response to the word line selection signals SELW1_21~SELWm_21 and SELW1_23~SELWm_23. As above, the word line selection signals SELW1_21~SELWm_21 and SELW1_23~SELWm_23 may be generated by the decoding circuit based on an address command provided from the controller. A word line electrically connected with the turned-on word line selection switch may receive a voltage of a selected global word line GWL.

Figure 10:
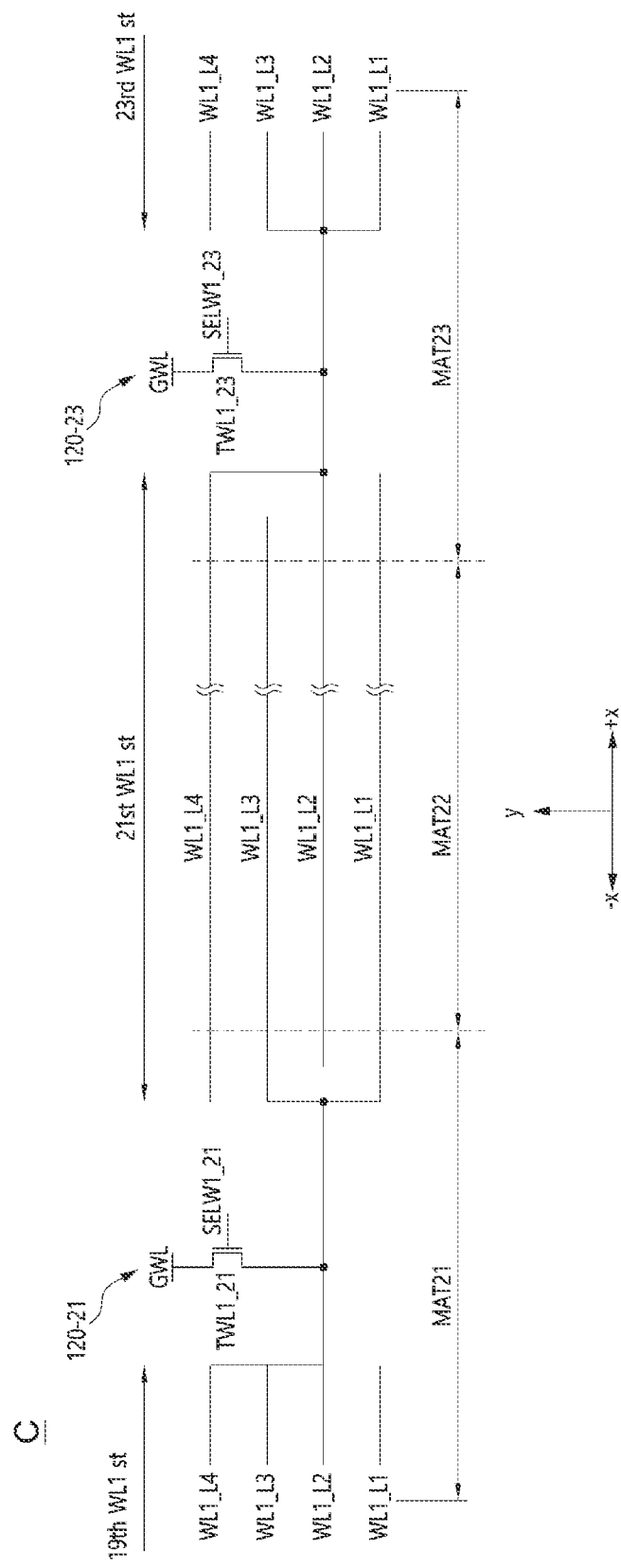
FIG. 10 is an equivalent circuit diagram of a portion "C" in FIG. 9.

FIG. 10 is an equivalent circuit diagram of a portion "C" in FIG. 9.

Referring to FIG. 10, the first word line selection switches TWL1_21 and TWL1_23 may be arranged at a first row of the 21st control circuit region 120-21 and the 23rd control circuit region 120-23. For example, the first word line stack structure 21st WL1 st may be connected between the adjacent first word line selection switches TWL1_21 and TWL1_23. In FIG. 10, the ordinal number "21st" of the reference numeral "21st WL1 st" indicates may mean a number of the mat MAT positioned at the left end of the word line stack structure the cardinal number "1" of the "21st WL1 st" may indicate a position of the row.

For example, the stacked word lines constituting the first word line stack structure 21st WL1 st may be arranged to pass a right portion of the 21st mat MAT21, the 22nd mat MAT22 and a left portion of the 23rd mat MAT23.

The first word line selection switch TWL1_21 in the 21st control circuit region 120-21 may correspond to an NMOS transistor including a gate, a source and a drain. The gate may be configured to receive the word line selection signal SELW1_21. The source may be electrically connected with the global word line GWL. The drain may be electrically connected to some word lines of the first word line stack structure 19th WL1 st and some word lines of the first word line stack structure 21st WL1 St. Although not shown in detail in FIG. 10, the stacked word lines of the first word line stack structure 19th WL1 st may be arranged to pass a right portion of a 19th mat (not shown), a 20th mat (not shown) and a left portion of the 21st mat MAT21.

One ends of odd word lines, i.e., the first and third levels of the word lines WL1_L1 and WL1_L3 in the first word line stack structure 21st WL1 st may be commonly connected to the drain of the first word line selection switch TWL1_21. Simultaneously, the other ends of even word lines, i.e., the second and fourth levels of the word lines WL1_L2 and WL1_L4 in the first word line stack structure 19th WL1 st may be commonly connected to the drain of the first word line selection switch TWL1_21. In some embodiments, even word lines or other elements may be first, third, and fifth word lines or elements and in other embodiments odd word lines or other elements may be first, third, and fifth word lines or elements. The words "simultaneous" and "simultaneously" as used herein with respect to a connection means that the connection takes place on overlapping intervals of time. For example, if a first connection takes place over a first interval of time and a second connection takes place simultaneously over a second interval of time, then the first and second intervals at least partially overlap each other such that there exists a time at which the first and second connections are both taking place.

In an example of an embodiment, one end may correspond to a left end of the word line and the other end may correspond to a right end of the word line in FIG. 10.

The first word line selection switch TWL1_23 in the 23rd control circuit region 120-23 may include a gate configured to receive the word line selection signal SELW1_23 and a source electrically connected to the global word line GWL. The drain of the first word line selection switch TWL1_23 may be commonly connected to one end of the odd word lines WL1_L1 and WL1_L3 in the first word line stack structure 23rd WL1 st and the other end of the even word lines WL1_L2 and WL1_L4 in the first word line stack structure 21st WL1 st, which is not connected to the first word line selection switch TWL1_21. Here, stacked word lines constituting the first word line stack structure 23rd WL1 st may arranged to pass a right portion of the 23rd mat MAT23, the 24th mat MAT24 and a left portion of the 25th mat MAT25.

When the 21st word line selection signal SELW1_21 may be enabled, the first word line selection switch TWL1_21 in the 21st control circuit region 120-21 may be turned-on. Thus, a global word line voltage may be electrically coupled to the even word lines WL1_L2 and WL1_L4 of the first word line stack structure 19th WL1 st and the odd word lines WL1_L1 and WL1_L3 of the first word line stack structure 21st WL1 st.

Meanwhile, when the 23rd word line selection signal SELW1_23 may be enabled, the first word line selection switch TWL1_23 in the 23rd control circuit region 120-23 may be turned-on. Thus, the global word line voltage may be provided to the even word lines WL2_L2 and WL2_L4 of the first word line stack structure 21st WL1 st and the odd word lines and WL1_L1 and WL1_L3 of the first word line stack structure 23rd WL1 st.

Figure 11:
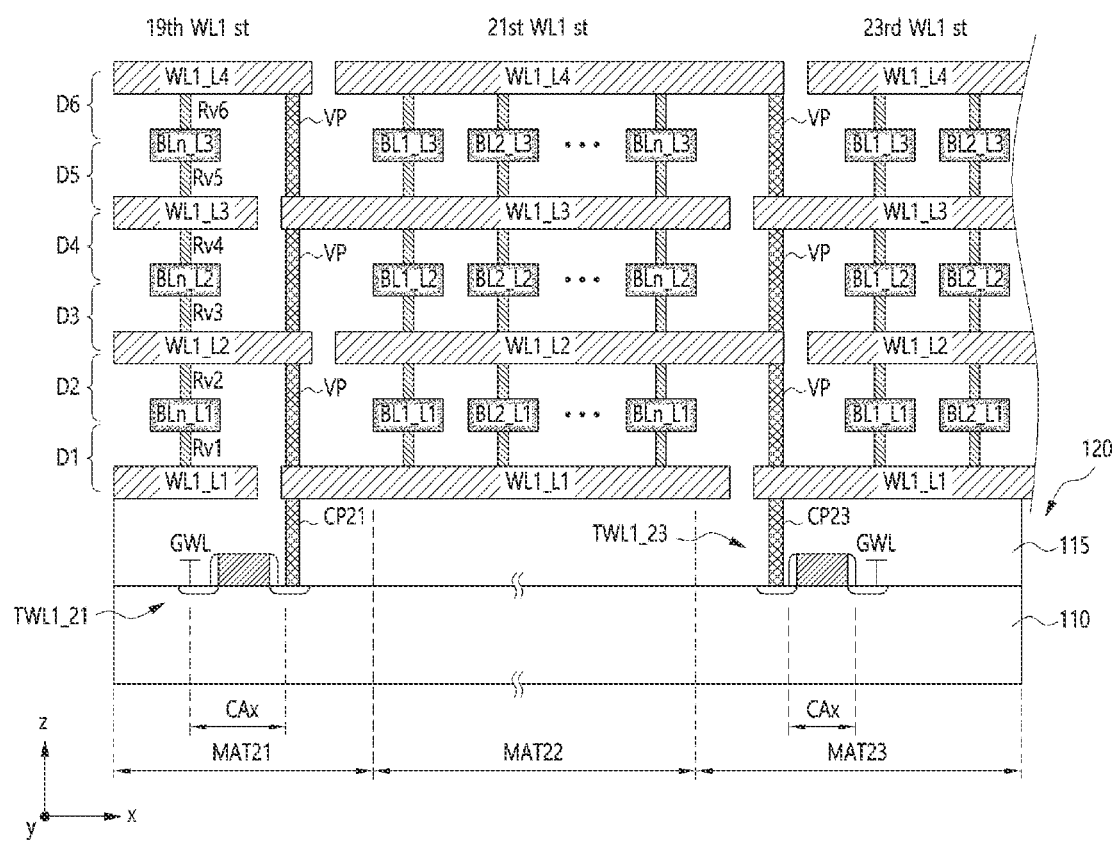
FIG. 11 is an enlarged cross-sectional view illustrating a memory device cut in a direction parallel to a word line in accordance with an example of an embodiment.

FIG. 11 is an enlarged cross-sectional view illustrating a memory device cut in a direction parallel to a word line in accordance with an example of an embodiment Referring to FIG. 11, a semiconductor substrate 110 may include a plurality of the mats MAT21~MAT23 and the control circuit regions 120-21, 120-22 and 120-23 corresponding to the mats MAT21~MAT23.

NMOS transistors as the word line selection switches TWL1_21 and TWL1_23 may be formed on portions of the semiconductor substrate 110 corresponding to the 21st control circuit region 120-21 and the 23rd control circuit region 120-23.

Although not depicted in drawings, NMOS transistors of other control circuit regions may be formed simultaneously when forming the word line selection switches TWL1_21 and TWL1_23.

A first insulation layer 115 may be formed on the semiconductor substrate 110 with the word line selection switches TWL1_21 and TWL1_23. First contact plugs CP21 and CP23 may be formed in the first insulation layer 115. The first contact plugs CP21 and CP23 may be configured to be electrically contacted with drains of the word line selection switches TWL1_21 and TWL1_23. Gates of the word line selection switches TWL1_21 and TWL1_23 may be electrically connected to a wiring (not shown) configured to transmit the first word line selection signals SELW1_21 and SELW1_23. Sources of the word line selection switches TWL1_21 and TWL1_23 may be electrically connected with the global word line GWL through the local word line (not shown) and the global word line selection switch (not shown). Thus, the control circuit layer 120 including the word line selection switches TWL1_21 and TWL1_23 may be formed on the semiconductor substrate 110.

The first level of the first word line WL1_L1 may be formed on the first insulation layer 115. The first level of the first word line WL1_L1 may be patterned to have the length corresponding to a distance between the word line selection switches TWL1_21 and TWL1_23. Although, the first level of the first word lines WL1 in the word line stack structure 21st WL1 st may he formed to pass the three mats MAT21, MAT22 and MAT23, the first level of the first word lines WL1 in the word line stack structure 21st WL1 st may have the length corresponding to a length of an x-axis direction of the two mats, because the first level of the first word lines WL1 in the word line stack structure 21st WL1 st is formed on the right portion of the 21st mat MAT21 and the left portion of the 23rd mat MAT23.

After forming the first level of the first word line WL1_L1, forming the resistor pattern Rv1, forming a first level of bit lines BL1_L1~BLn_L1, forming the resistor pattern Rv2 and forming a second level of the first word line WL1-L2 may be repeated at least three times to form at least six decks D1~D6. Although not depicted in drawings, insulation layers may be formed between the resistor patterns Rv positioned at a same plane, between the bit lines BL positioned at a same plane and between adjacent first word lines WL1 positioned at a same plane.

The drain of the first word line selection switch TWL1_21 in the 21st control circuit region 120-21 may be electrically connected with the other ends of the second and fourth levels of the first word lines WL1_L2 and WL1_L4 in the first word line stack structure 19th WL1 st through the contact plug CP21 and one ends of the first and third levels of the first word lines WL1_L1 and WL1_L3 in the first word line stack structure 21st WL1 st through a via plug VP.

The drain of the first word line selection switch TWL1_23 in the 23rd control circuit region 120-23 may be electrically connected with the other ends of the second and fourth levels of the first word lines WL1_L2 and WL1_L4 in the first word line stack structure 21st WL1 st and one ends of the first and third levels of the first word lines WL1_L1 and WL1_L3 in the first word line stack structure 23rd WL1 st through the contact plug CP23 and the via plug VP.

Thus, when the first word line selection switch TWL1_21 of the 21st control circuit region 120-21 is turned-on, the global word line voltage may be provided to the second and fourth levels of the first word lines WL1_L2 and WL1_L4 in the first word line stack structure 21st WL1 st and the first and third levels of the first word lines WL1_L1 and WL1_L3 in the first word line stack structure 23rd WL1 st.

When the first word line selection switch TWL1_23 of the 23rd control circuit region 120-23 is turned-on, the global word line voltage may be provided to the second and fourth levels of the first word lines WL1_L2 and WL1_L4 in the first word line stack structure 21st WL1 st and the first and third levels of the first word lines WL1_L1 and WL1_L3 in the first word line stack structure 23rd WL1 st.

In an example of an embodiment, the word lines WL1_L1, WL1_L2, WL1_L3 and WL1_L4 in the first word line stack structure WL1 st may have substantially the same length. However, in order to readily connect the word line selection switches TWL1_21 and TW1_L23 with the stacked word lines WL1_L1, WL1_L2, WL1_L3 and WL1_L4, a portion of each word lines connected to the corresponding word line selection switch may be extended (shifted) toward the corresponding word line selection switch.

Figure 12:
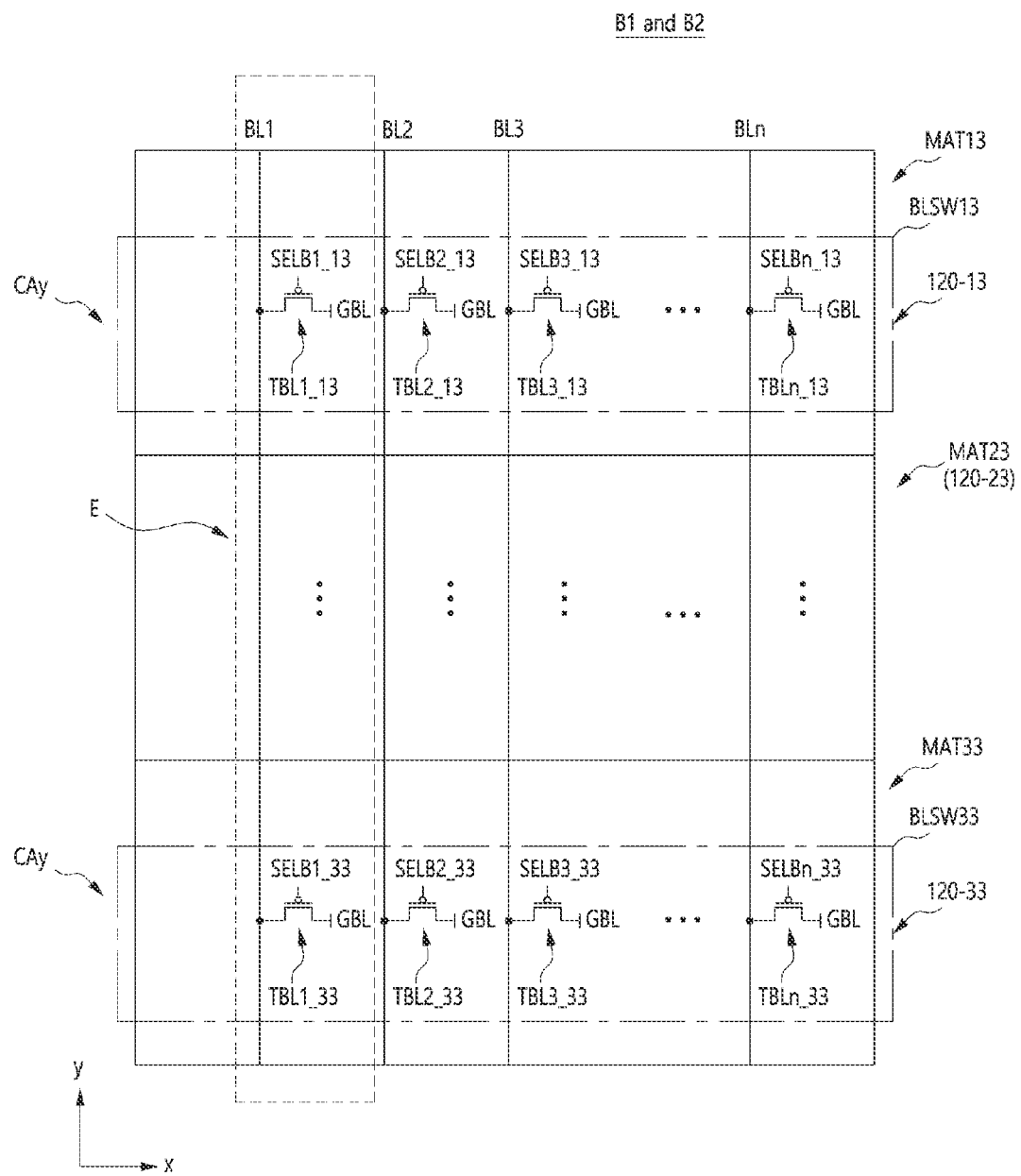
FIG. 12 is a view illustrating a connection relation between a bit line in a plurality of mats and a bit line decoder in a control circuit region in accordance with an example of an embodiment.

FIG. 12 is a view illustrating a connection relation between a bit line in a plurality of mats and a bit line decoder in a control circuit region in accordance with an example of an embodiment. A portion of the mat corresponding to "B1" in FIG. 3 may be actually positioned on a plane different from a plane on which the control circuit region corresponding to "B2" in FIG. 4 may be positioned. For conveniences of explanations, FIG. 12 may depict the portion of the mat and the control circuit region on a same plane. Further, the bit line decoder BLSW and the bit lines BL1~BLn might not be depicted in FIG. 12. FIG. 12 may show the 13th, 23rd and 33rd mats MAT13, MAT23 and MAT33 and the control circuit regions corresponding to the 13th, 23rd and 33rd mats MAT13, MAT23 and MAT33.

Referring to FIG. 12, the bit line decoders BLSW13 and BLSW33 may be arranged in the control circuit regions 120-13 and 120-33 under the 13th mat MAT13 and the 33rd mat MAT33. The bit line decoders BLSW13 and BLSW33 may be located at second central portions CAy of the 13th control circuit region 120-13 and the 33rd control circuit region 120-33. The second central portions CAy may correspond to central portions of a y-axis direction of the 13th and 33rd control circuit regions 120-13 and 120-33. The bit line decoder BLSW may include bit line selection switches TBL1~TBLn positioned at columns.

The bit lines BL1~BLn for each column may be divided into a plurality of bit line stack structures based on the bit line decoders BLSW_13 and BLSW_33. Each of the bit line stack structures may include the stacked bit lines. The stacked bit lines constituting the bit line stack structure may have a length corresponding to a length between the pair of the bit line decoders BLSW_13 and BLSW_33 adjacent along the column direction.

For example, stacked numbers of the bit lines in the bit line stack structure may be less by one number than the stacked numbers of the word lines in the word line stack structure.

As mentioned above, the bit line selection switches TBL1~TBLn may include PMOS transistors turned-on in response to the bit line selection signals SELB1_13~SELBn_13, and SELB1_33~SELBn_33. The bit line selection signals SELB1_13/\SELBn_13 and SELB1_33~SELBn_33 may be generated by the decoding circuit based on an address command provided from the controller. The bit line electrically connected with the turned-on bit line selection switch may receive a voltage of a selected global bit line GBL.

Figure 13:
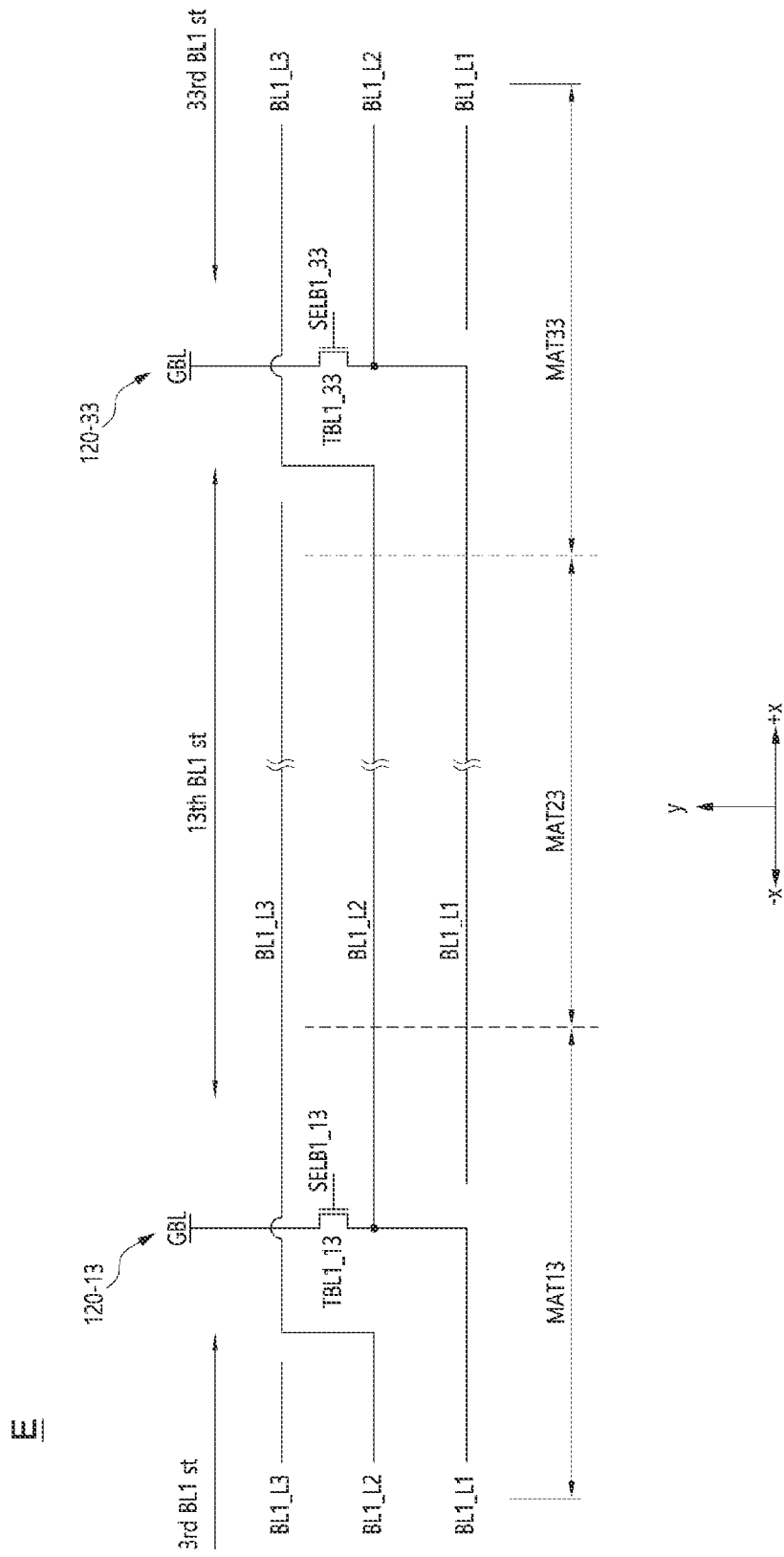
FIG. 13 is an equivalent circuit diagram of a portion "E" in FIG. 12.

FIG. 13 is an equivalent circuit diagram of a portion "E" in FIG. 12.

Referring to FIG. 13, a PMOS transistor as the first bit line selection switches TBL1_13 and TBL1_33 may be connected to the 13th control circuit region 120-13 and the 33rd control circuit region 120-33 by the columns. The first bit line selection switch TBL1_13 in the 13th control circuit region 120-13 may include a gate, a source and a drain. The gate of the first bit line selection switch TBL1_13 may be configured to receive the bit line selection signal SELB1_13. The source of the first bit line selection switch TBL1_13 may be electrically connected with the global word line GBL. Although not depicted in drawings, the local bit line selection switch and the local bit line may be connected between the global bit line GBL and the first bit line selection switch TBL1_13. The drain of the first bit line selection switch TBL1_13 may be electrically connected to any one of a plurality of bit lines BL1_L1 . . . constituting a first bit line stack structure 3rd BL1 st. The stacked bit lines constituting the first bit line stack structure 3rd BL1 st may be arranged to pass two mats that are arranged consecutively along the -y direction from the 13th mat MAT13. For example, the drain of the first bit line selection switch TBL1_13 may be electrically connected to the first level of the first bit line BL1_L1 in the first bit line stack structure 3rd BL1 st and one end of a second level of the first bit line BL1_L2 in a first bit line stack structure 13th BL1 St. The other end of the second level of the first bit line BL1_L2 in the first bit line structure 13th BL1 st may be electrically connected to one end of a third level of the first bit line BL1_L3 in the first bit line structure 33rd BL1 st. The stacked bit lines constituting the first bit line stack structure 13th BL1 st may be arranged to pass a right portion of the 13th mat MAT13, the 23rd mat MAT23 and a left portion of the 33rd mat MAT33. The stacked bit lines constituting the first bit line stack structure 33rd BL1 st may be arranged to pass two mats that are arranged consecutively along the +y direction from the 33rd mat MAT33.

The first bit line selection switch TBL1_33 in the 33rd control circuit region 120-33 may include a gate, a source and a drain. The gate may be configured to receive the bit line selection signal SELB1_33. The source may be electrically connected with the global word line GBL. The drain of the first bit line selection switch TBL1P_33 may be electrically connected to any one of the first bit line stack structure 13th BL1 st and any one of a 33rd first bit line stack structure 33rd BL1 st. For example, the drain of the first bit line selection switch TBL1_33 may be electrically connected to a first level of the first bit line BL1_L1 in the first bit line stack structure 13th BL1 st and a second level of the first bit line BL1_L2 in the first bit line stack structure 33rd BL1 st.

The 23rd control circuit region 120-23 between the 13th control circuit region 120-13 and the 33rd control circuit region 120-33 might not be depicted. The 23rd control circuit region 120-23 may include the word line decoder WLSW in place of the bit line decoder BLSW.

When the first bit line selection switch TBL1_13 in the 13th control circuit region 120-13 may be turned-on, a global bit line voltage may be applied to the first level of the first bit line BL1_L1 in the first bit line stack structure 3rd BL1 st, the second level of the first bit line BL1_L2 in the first bit line stack structure 13th BL1 st and the third level of the first bit line BL1_L3 in the first bit line stack structure 33rd BL1 st. Although not depicted in FIG. 13, the word lines may be arranged on the 13th, 23rd, and 33rd mats MAT13, MAT23 and MAT33 along the rows. A voltage difference may be generated in the memory cell at the intersected portion of the selected word line to which the global word line voltage may be provided to perform the memory operation.

According to an example of an embodiment, the word line selection switch may select at least two word lines constituting a corresponding word line stack structure, which are not adjacent, but the bit line selection switch may select one of the stacked bit lines constituting the corresponding bit line stack structure.

Particularly, one bit line selection switch may simultaneously control (select) a bit line of each of adjacent n (n is an integer greater than 2) numbers bit line stack structures. The "n" may be a number of the bit lines constituting the bit line stack structure. The selected bit line of each of adjacent n numbers bit line stack structures has a different level.

For example, if "n" is 3, the each of the bit line stack structures is configured by sequentially stacking a first level bit line, a second level bit line and a third level bit line. Here, the first level bit line may mean a bit line positioned at a first level. The second level bit line may mean a bit line positioned at a second level higher than the first level. The third level bit line may mean a bit line positioned at a third level higher than a second level.

The first level bit line of a bit line stack structure (hereinafter, first closest bit line stack structure) being first closest to the bit line selection switch is directly contacted to the bit line selection switch. The second level bit line of a bit line stack structure (hereinafter, second closest bit line stack structure) being the closet to the first closest bit line stack structure in the y direction, is electrically connected to the first level bit line of the first closest bit line stack structure. The third level bit line of a bit line stack structure (hereinafter, third closest bit line stack structure) being the closet to the second closest bit line stack structure in the y direction, is electrically connected to the second level bit line of the second closest bit line stack structure. Thus, when the bit line selection switch is turned on, the global bit line voltage is transmitted to the first level bit line of the first closest bit line stack structure, the second level bit line of the second closest bit line stack structure, and third level bit line of the third closest bit line stack structure, in a step shape.

As a result, the memory device of the example of the embodiment is not limited by number of stacking of word lines and bit lines.

Figure 14:
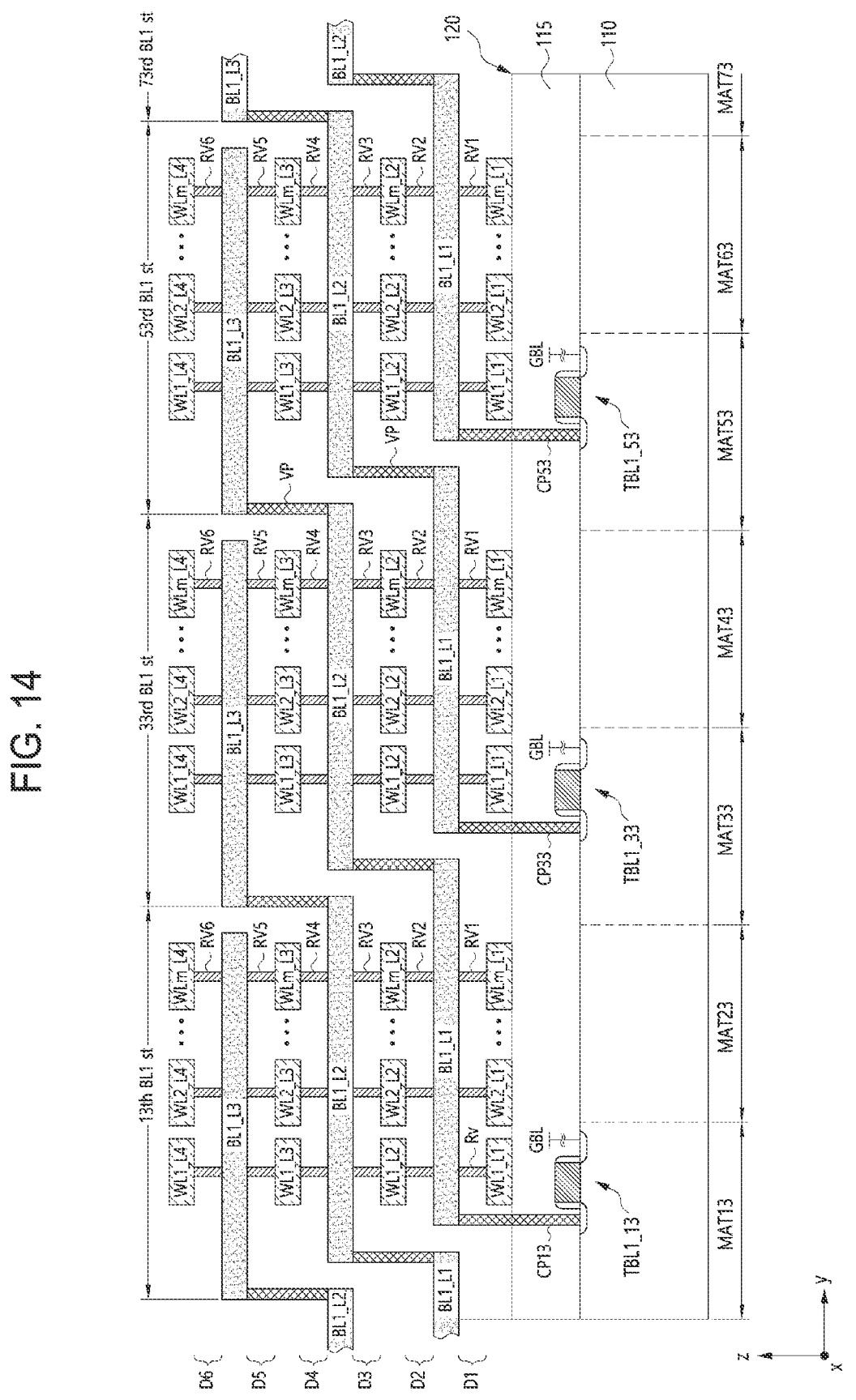

FIG. 14 is an enlarged cross-sectional view illustrating a memory device cut in a direction parallel to a bit line in accordance with an example of an embodiment.

The cross-sectional view in FIG. 14 may be taken along a direction substantially parallel to a first bit direction in the 13th mat MAT13, the 23rd mat MAT23, the 33rd mat MAT33, the 43rd mat MAT43, the 53rd mat MAT53, the 63rd mat MAT63 and the 73rd mat MAT73 parallel to each other along the y-direction. The 13th mat MAT13, the 23rd mat MAT23, the 33rd mat MAT33, the 43rd mat MAT43, the 53rd mat MAT53, the 63rd mat MAT63 and the 73rd mat MAT73 may have substantially the same size. In order to precisely show features of an example of an embodiment, principal portions may be enlarged in FIG. 14.

Referring to FIG. 14, a semiconductor substrate 110 may include a plurality of the mats. For example, in order to form PMOS transistors in the 13th mat MAT13, the 23rd mat MAT23, the 33rd mat MAT33, the 43rd mat MAT43, the 53rd mat MAT53, the 63rd mat MAT63 and the 73rd mat MAT73, n-well regions (not shown) may be formed in the semiconductor substrate 110. The PMOS transistors may be formed in the n-well region of the 13th mat MATI3, the 33rd mat MAT33 and the 53rd mat MAT53 to form bit line selection switches TBL1_13, TBL1_33, TBL1_53, etc. Although not depicted in drawings, the global selection switch may be formed in the n-well region. The bit line selection switches TBL1_13, TBL1_33 and TBL1_53 may be substantially coplanar with the word line selection switches (not shown). However, the bit line selection switches TBL1_13, TBL1_33 and TBL1_53 may be formed by processes different from processes for forming the word line selection switches (not shown).

A first insulation layer 115 may be formed on the semiconductor substrate 110 with the bit line selection switches TBL1_13, TBL1_33 and TBL1_53 and the word line selection switches (not shown). First contact plugs CP13, CP33 and CP53 may be formed in the first insulation layer 115. The first contact plugs CP13, CP33 and CP53 may be configured contacted to the drains of the bit line selection switches TBL1_13, TBL1_33 and TBL1_53. Gates of the bit line selection switches TBL1_13, TBL1_33 and TBL1_53 may be electrically connected to wirings configured to transmit the first bit line selection signals SELB1_13, SELB_33 and SELB1_53, respectively. Sources of the bit line selection switches TBL1_13, TBL1_33 and TBL1_53 may be electrically connected with the global bit line GBL through the local bit line (not shown) and the global bit line selection switch (not shown). Thus, the bit lint selection switches and the word line selection switches may form part of the control circuit layer 120.

The first level of the word lines WL1_L1~WLm_L1 may be formed on the first insulation layer 115. The first level of the word lines WL1_L1~WLm_L1 may be spaced apart from each other by a uniform gap. The first level of the word lines WL1_L1~WLm_L1 may be extended in the x-direction.

The resistor pattern Rv may be formed on each of the first level of the word lines WL1_L1~WLm_L1. The resistor pattern Rv may have a width substantially equal to or less than a width of the first level of the word lines WL_L1~WLm_L1. The first level of the first bit lines BL1_L1 may be formed to be intersected with the first level of the word lines WL1_L1~WLm_L1. As mentioned above, each of the first level of the first bit lines BL1_L1 may be positioned between the adjacent two bit line selection switches TBL1_13, TBL1_33 and TBL1_53. The first level of the first bit line BL1_L1 may have one end and the other end along the y-direction corresponding to a lengthwise direction of the first bit line BL1_L1. A first deck D1 may be formed of the first level of the word line WL1_L1~WLm_L1, the resistor patterns Rv1 and the first level of the first bit line BL1_L1. The one end of each first level of first bit lines BL1_L1 may be electrically connected to the bit line selection switches TBL1_13, TBL1_33 and TBL1_53 under the first level of the first bit lines BL1_L1, respectively.

Before forming the first level of the first bit line BL1_L1, contact plugs CP13, CP33 and CP53 may be formed in the insulation layer 115. The contact plugs CP13, CP3 and CP53 may make contact with the drains of the bit line selection switches TBL1_13, TBL1_33 and TBL1_53. A selected one of the one end and the other end of the first level of the first bit line BL1_L1 may be electrically connected with the bit line selection switch through the contact plugs CP13, CP33 or CP53.

Alternatively, the resistor patterns Rv may be formed on the first level of the first bit line BL1_L1. The second level of the word lines WL1_L2~WLm_L2 may be formed to be intersected with the first level of the first bit line BL_L1 to form the second deck D2.

The word lines WL1~WLm and the bit line BL1 may be alternately stacked to form the plurality of the decks D1~D6.

For example, one end of the first level of the first bit line BL1_L1 in the first bit line stack structure 13th BL1 st may be electrically connected with the bit line selection switch TBL1_13 in the 13th control circuit region 120-13 by the contact plug CP13. The stacked first bit lines constituting the first bit line stack structure 13th BL1 st may be arranged to pass a right (lower) portion of the 13th mat MAT13, the 23rd mat MAT23 and a left (upper) portion of the 33rd mat MAT33. The other end of the first level of the first bit line BL1_L1 in the first bit line stack structure 13th BL1 st may be electrically connected with one end of the second level of the first bit line BL1_L2 in the first bit line stack structure 33rd BL1 st. The stacked first bit lines constituting the first bit line stack structure 33rd BL1 st may be arranged to pass a right (lower) portion of the 33rd mat MAT33, the 43rd mat MAT43 and a left (upper) portion of the 53rd mat MAT53 by the via plug VP. The other end of the second level of the first bit line BL1_L2 in the first bit line stack structure 33rd BL1 st may be electrically connected with one end of the third level of the first bit line BL1_L3 in the first bit line stack structure 53rd BL1 st by the via plug VP. The stacked first bit lines constituting the first bit line stack structure 53rd BL1 st may be arranged to pass a right (lower) portion of the 53rd mat MAT53, the 63rd mat MAT63 and a left (upper) portion of the 73rd mat MAT73.

As a result, each of the stacked bit lines constituting the bit line stack structure is controlled by different bit line switches, one memory cell may be selected from the plurality of mats.

Figure 15:
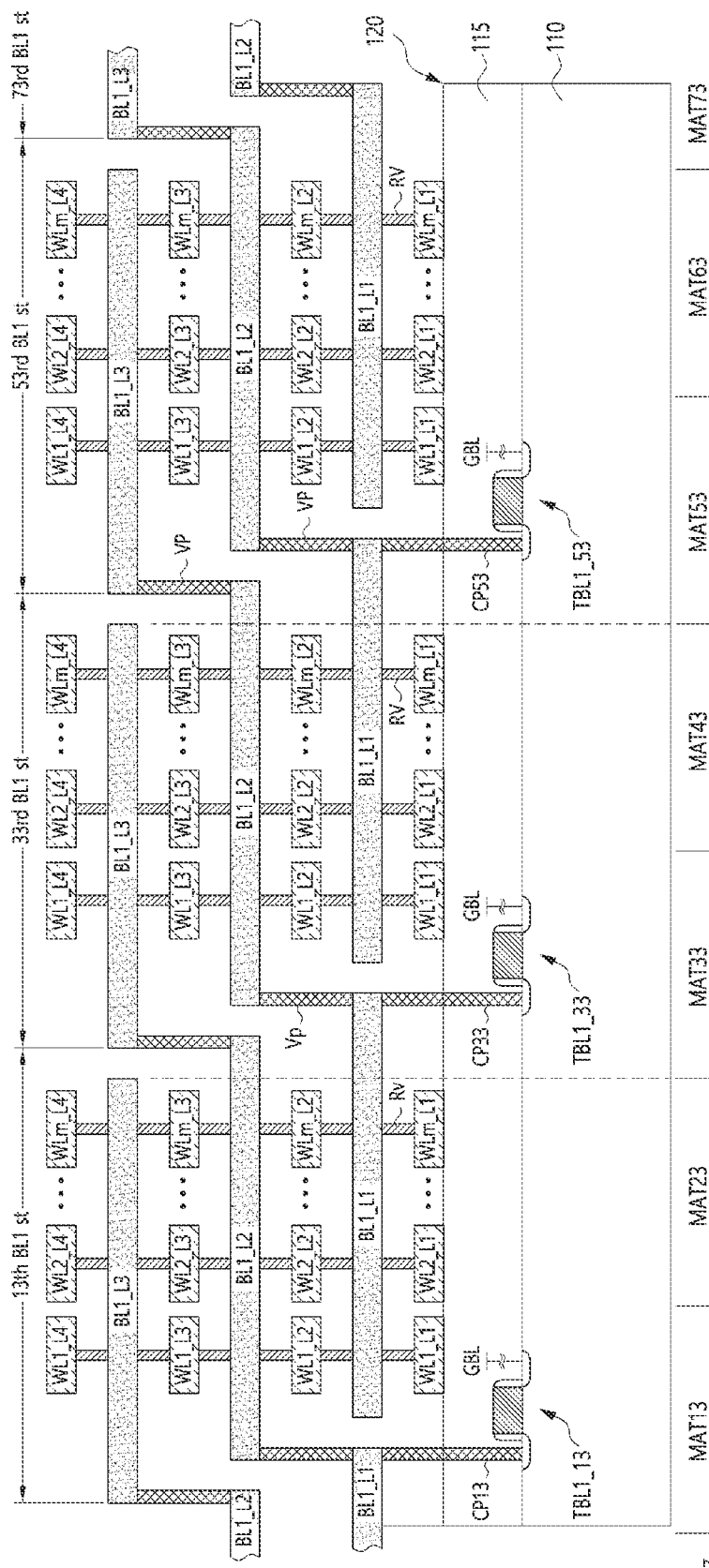
FIG. 15 is a cross-sectional view illustrating a memory device cut in a bit line direction in accordance with an example of an embodiment.

FIG. 15 is a cross-sectional view illustrating a memory device cut in a bit line direction in accordance with an example of an embodiment. The cross-sectional view in FIG. 15 may be similar to the cross-sectional view in FIG. 14 except for a connection between the bit line selection switch and the bit lanes.

Referring to FIG. 15, word lines WL1~WLm, resistor patterns Rv and bit lines BL1~BLn may be arranged and stacked in a structure substantially same as the structure in FIG. 14 and a connection structure between the bit lines and the bit line selection switch is different from that of FIG. 14.

The drain of the first bit line selection switch TBL1_33 may be connected to the other end of the first level of the first bit line BL1_L1 in the first bit line stack structure 13th BL1 st and one end of the second level of the first bit line BL1_L2 in the 33rd first bit line stack structure 33rd BL1 st by the contact plug CP33 and the via plug VP. Further, the other end of the second level of the first bit line BL1_L2 in the first bit line stack structure 13th BL1 st may be electrically connected with one end of the third level of the first bit line BL1_L3 in the 53rd first bit line stack structure 53rd BL1 st by the via plug VP.

The drain of the first bit line selection switch TBL1_53 may be connected to the other end of the first level of the first bit line BL1_L1 in the 33rd first bit line stack structure 33rd BL1 st and one end of the second level of the first bit line BL1_L2 in the first bit line stack structure 53rd BL1 st by the contact plug CP53 and the via plug VP. Further, the other end of the second level of the first bit line BL1_L2 in the first bit line stack structure 53rd BL1 st may be electrically connected with one end of the third level of the first bit line BL1_L3 in the first bit line stack structure 73rd BL1 st In an example of an embodiment, the stacked bit lines having the same length in one bit line stack structure may be overlapped with each other. Alternatively, as shown in FIGS. 14 and 15, a portion directly or indirectly making contact with the bit line selection switch may be extended for allowing an accurate contact between the portion and the bit line selection switch.

Figure 16:
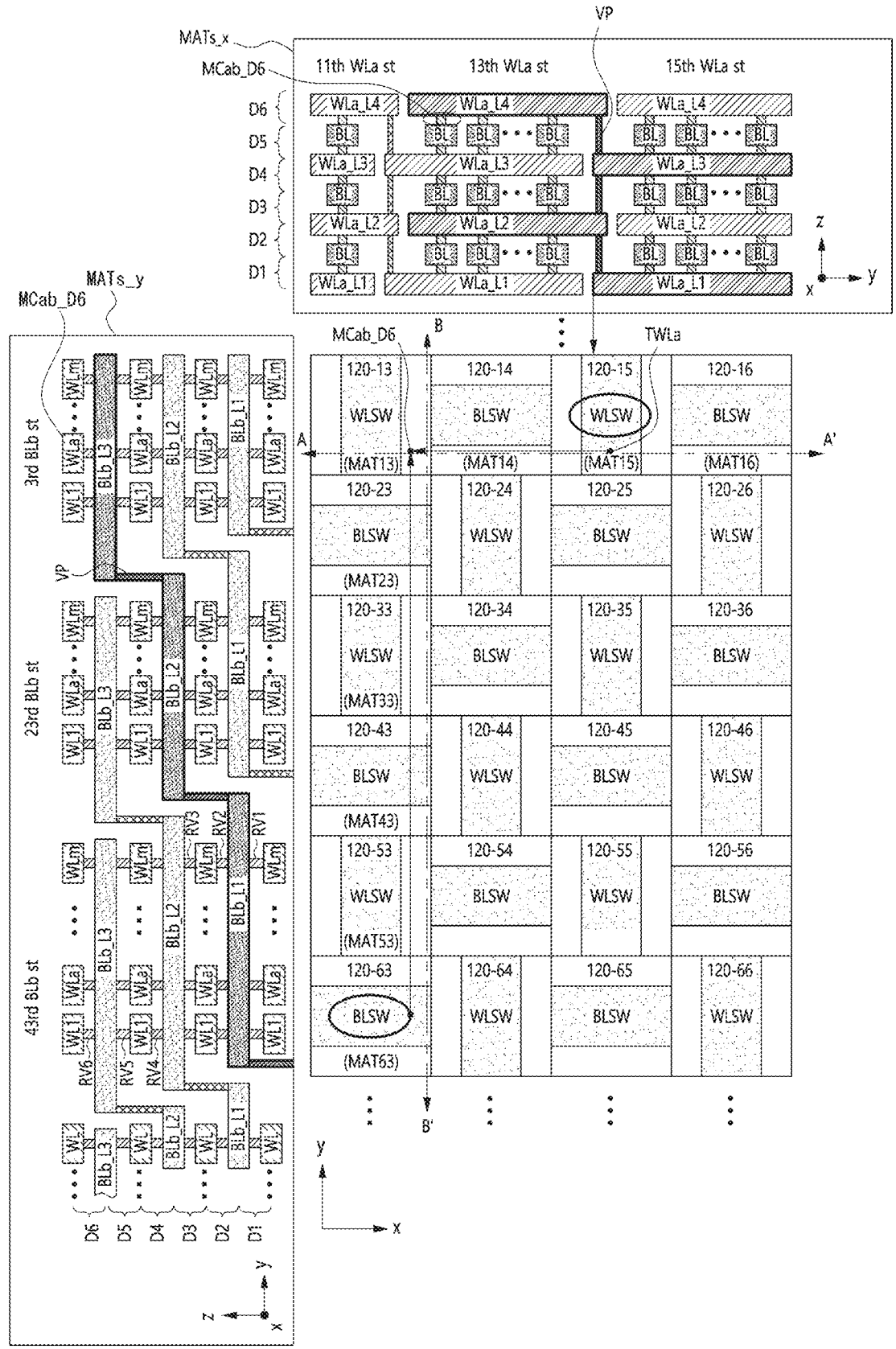
FIG. 16 is a view illustrating an operation for selecting a memory cell in a specific mat in accordance with an example of an embodiment.

FIG. 16 is a view illustrating an operation for selecting a memory cell in a specific mat in accordance with an example of an embodiment. In an example of an embodiment, an operation of selecting a memory cell MCab_D6 located in an ath row and a bth column of a 13th mat MAT13 may be explained, for example. A reference numeral MATs_x may represent a cross-sectional view of a 13th mat MAT13 to 16th mat MAT16 taken along a line of A-A'. A reference numeral MATs_y may represent a cross-sectional view of the 13th mat MAT13, 23rd mat MAT23, 33rd mat MAT33, 43rd mat MAT43, 53rd mat MAT53 and 63rd mat MAT63 taken along a line of B-B'. The word line decoder WLSW and the bit line decoder BLSW may be alternately arranged in the x-direction and the y-direction. In an example of an embodiment, when the word line decoder WLSW may be located at the 13th control circuit region 120-13, the bit line decoder BLSW may be located at the 14th and 23rd control circuit regions 102-14 and 120-23 adjacent to the 13th control circuit region 120-13 in the x-direction and the y-direction. In an example of an embodiment, one word line stack structure may include the four levels of the word lines and one bit line stack structure may include the three levels of the bit lines.

Referring to FIG. 16, in order to select the memory cell MCab_D6 located on the sixth deck D6 of the 13th mat MAT13, a fourth level of an ath word line WLa_L4 in an ath word line stack structure 13th WLa st and a third level of a bth bit line BLb_L3 in a bth bit line stack structure 3rd BLb st may be selected.

As mentioned above, the fourth level of the ath word line WLa_L4 in the ath word line stack structure 13th WLa st may be connected to the word line decoder WLSW in the 15th control circuit region 120-15. For example, the fourth level and second level of the ath word lines WLa_L2 and WLa_L4 in the ath word line stack structure 13th WLa st and a third level and first level of the ath word lines WLa_L3 and WLa_L1 in the ath word line stack structure 15th WLa st may be electrically connected with the word line decoder WLSW positioned in the 15th control circuit region 120-15.

Thus, the global word line voltage may be simultaneously transmitted to the fourth level and the second level of the ath word lines WLa_L4 and WLa_L2 in the ath word line stack structure 13th WLa St and the third level and first level of the ath word lines WLa_L3 and WLa_L1 in the ath word line stack structure 15th WLa st.

In order to select the third level of the bth bit line BLb_L3 in the bth bit line stack structure 3rd BLb st, a bit line decoder BLSW in the 63th control region 120-63 may be turned on. The bit line decoder BLSW in the 63th control region 120-63 may be electrically connected to the third level of the bth bit line BLb_L3 in the bth bit line stack structure 3rd BLb st through a first level of the bth bit line BLb_L1 in a bth bit line stack structure 43rd BLb St and a second level of the bth bit line BLb_L2 in a bth bit line stack structure 23rd BLb st.

That is, the third level of the bth bit line BLb_L3 in the bth bit line stack structure 3rd BLb st may be connected to the second level of the bth bit line BLb_L2 in the bth bit line stack structure 23rd BLb st and the first level of the bth bit line BLb_L1 in the bth bit line stack structure 43rd BLb st adjacent to the bth bit line stack structure 23rd BLb st in the column direction, in a step shape.

The global bit line voltage may be simultaneously applied to the first level of the bth bit line BLb_L1 in the bth bit line stack structure 43rd BLb st, the second level of the bth bit line BLb_L2 in the bth bit line stack structure 23rd BLb st and the third level of the bth bit line BLb_L3 in the bth bit line stack structure 3rd BLb st. The global word line voltage may be applied to the second and fourth levels of the word lines WLa_L2 and WLa_L4 in the ath word line stack structure 13th WLa st and the first and third levels of the word lines WLa_L1 and WLa_L3 in the ath word line stack structure 15th WLa st.

Therefore, a resistance of the resistor pattern Rv between the fourth level of the ath word line WLa_L4 in the ath word line stack structure 13th WLa st and the third level of the bth bit line BLb_L3 in the bth bit line stack structure 3rd BLb st may be changed, so a memory operation of the memory cell MCab_D6 is performed.

In FIG. 16, the connection structure between the bit line stack structure and the bit line decoder may use the structure in FIG. 14. Alternatively, the connection structure between the bit line stack structure and the bit line decoder may use the structure in FIG. 15.

According to an example of an embodiment, in the bank including the stacked memory cell, the word line decoder and the bit line decoder may be alternately arranged by the mat. Further, in the word line stack structure, the adjacent stacked word lines might not be simultaneously selected. The bit lines on the different levels in the adjacent bit line stack structures on the same column may be connected with each other in the stepped shape to effectively select only one memory cell.

As a result, although at least six word lines and six bit lines may be stacked, one memory cell may be effectively selected. Therefore, the resistive memory device may have an improved integration degree.

In FIGS. 9, 10, 12 and 13, the global word line signal or the global bit line signal by one switch may be transmitted to the selected word line and the selected bit line. Alternatively, as shown in FIG. 7, the global word line switch and the global bit line switch may be hierarchically connected with each other.

The above described embodiments are intended to illustrate and not to limit the disclosure. Various alternatives and equivalents are possible. The disclosure is not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A memory device comprising:
a bank layer arranged on a semiconductor substrate, the bank layer including a plurality of mats, each of the mats including a plurality of stacked decks, and each of the decks including a plurality of memory cells; and
a control circuit layer arranged between the semiconductor substrate and the bank layer, the control circuit layer including a plurality of control circuit regions corresponding to the mats,
wherein the plurality of the stacked decks comprises a plurality of stacked word lines, a plurality of stacked bit lines intersected with the stacked word lines, and
wherein a word line decoder for controlling the stacked word lines and a bit line decoder for controlling the stacked bit lines are respectively located in the control circuit regions and the word line decoder and bit line decoder are alternately arranged in the control circuit layer along a word line extension direction and a bit line extension direction,
wherein the stacked word lines are divided by a length between a pair of the adjacent word line decoders in a row direction parallel with the word line extension direction to form a plurality of word line stack structures, and
wherein the stacked bit lines are divided by a length between a pair of the adjacent bit line decoders in a column direction parallel with the bit line extension direction to form a plurality of bit line stack structures.

2. The memory device of claim 1, wherein each of the mats has a plurality of row regions and a plurality of column regions intersected with the row regions,
wherein the stacked word lines are extended in each of the row regions, and the stacked bit lines are extended in each of the column regions.

3. The memory device of claim 1, wherein the stacked decks further comprise a resistor pattern interposed between intersected portions between the stacked word lines and the stacked bit lines.

4. The memory device of claim 1, wherein odd word lines in the plurality of word line stack structures are electrically connected to a word line decoder located under one end of the word line stack structure, and even word lines in the plurality of word line stack structures are electrically connected with a word line decoder located under the other end of the plurality of word line stack structures.

5. The memory device of claim 1, wherein the word line decoder comprises a word line selection switch arranged in each of the row regions of the control circuit region in which the word line decoder is arranged.

6. The memory device of claim 5, wherein the word line selection switch is simultaneously connected to even word lines in one word line stack structure located on one side of the word line selection switch and odd word lines in the other word line stack structure located on the other side of the word line selection switch.

7. The memory device of claim 1, wherein any one of one and the other end of a lowermost bit line in the bit line stack structure is electrically connected to the bit line decoder under the bit line stack structure.

8. The memory device of claim 1,
wherein when n number of bit lines are stacked to form the bit line stack structure, one selected bit line of each of the n numbers of bit line stack structures continuously arranged in the column direction is electrically connected to each other,
wherein the one bit lines selected from each of the n numbers of bit line stack structures are located at different levels, and
wherein n is an integer greater than 3.

9. The memory device of claim 8, wherein one end of a (n−1)th level of a bit line in the bit line stack structure is electrically connected to the other end of a (n−2)th level of a bit line in an adjacent bit line stack structure arranged from a first side of the bit line stack structure in the column direction without a disconnection.

10. The memory device of claim 9, wherein the other end of the (n−1)th level of the bit line in bit line stack structure is electrically connected to one end of a nth level of a bit line in an adjacent bit line stack structure arranged from a second side of the bit line stack structure in the column direction without a disconnection.

11. A memory device comprising:
a control circuit layer including a plurality of control circuit regions, the control circuit regions arranged on a semiconductor substrate in a matrix shape along a first direction and a second direction; and
a bank layer arranged on the control circuit layer, the bank layer including a plurality of memory cells,
wherein the plurality of the memory cells comprises a plurality of first electrode lines, a plurality of stacked second electrode lines intersected with the first electrode lines and a resistor pattern arranged at intersected points between the first electrode lines and the second electrode lines,
wherein the plurality of the control circuit regions comprises a plurality of first control circuit regions in which a first electrode line selector for selecting the first electrode line is arranged, and a plurality of second control circuit regions in which a second electrode line selector for selecting the second electrode lines is arranged,
wherein the first control circuit regions and the second control circuit regions are alternately arranged in the first and second directions,
wherein the first electrode lines are divided by a length between a pair of the adjacent first electrode line selectors in the first direction to form a plurality of first electrode line stack structures, and
adjacently stacked first electrode lines among the stacked first electrode lines in the first electrode line stack structure are controlled by different first electrode line selectors.

12. The memory device of claim 11, wherein the first electrode lines and the second electrode lines are alternately stacked, and the resistor pattern is positioned at intersected portions between the first electrode lines and the second electrode lines, thereby stacking the memory cells.

13. The memory device of claim 12, wherein one ends of odd first electrode lines in the first electrode line stack structure are electrically connected to a first electrode line selector located under one end of the first electrode line stack structure and the other end of even first electrode lines in the first electrode line stack structure are electrically connected to a first electrode line selector located under the end of the first electrode line stack structure.

14. The memory device of claim 12, wherein the stacked second electrode lines are divided by a length between a pair of the adjacent second electrode line selectors in the second direction to form a plurality of second electrode line stack structures, and wherein the stacked second electrode lines constituting the second electrode line stack structure are controlled by different second electrode line selectors.

15. The memory device of claim 14, wherein when n numbers of second electrode lines are stacked to form a second electrode line stack structure, one selected second electrode line of each of the n numbers of second electrode line stack structures continuously arranged in the column direction is electrically connected to each other, wherein the one selected second electrode lines of the n numbers second electrode line structures are located at different levels, and wherein n is an integer greater than 3.

16. The memory device of claim 12, wherein when a first voltage is applied to at least one first electrode line constituting a selected first electrode line stack structure, and a second voltage is applied to any one of the second electrode lines constituting a selected second electrode line stack structure, a memory cell located at an intersected portion of the at least one first electrode line to which the first voltage is applied and the selected second electrode line to which the second voltage is applied, is selected, and a difference between the first voltage and the second voltage is equal or greater than a threshold voltage of the resistor pattern.

17. A memory device comprising:

a plurality of word line stack structures including n numbers of stacked word lines in a row direction;

a plurality of bit line stack structures including (n−1) numbers of stacked bit lines in a column direction intersected with the row direction;

a plurality of word line selection switches arranged at lower regions of both ends of each of the word line stack structures; and a plurality of bit line selection switches arranged at lower regions of both ends of each of the bit line stack structures, wherein a first voltage is provided to at least one word line of the word line stack structure electrically connected to the enabled word line selection switch when any one of the word line selection switches is enabled, and wherein a second voltage is provided to a selected one bit line of the bit line structure electrically connected to the enabled bit line selection switch when any one of the bit line selection switches is enabled, and wherein the stacked bit lines are divided by a length between a pair of the adjacent bit line selection switches in the column direction to form the plurality of bit line stack structures.

18. The memory device of claim 17, wherein the stacked bit lines constituting the bit line stack structure are electrically connected to different bit line selection switches, respectively.

19. The memory device of claim 17, further comprising a first control circuit region where the word lines selection switches are arranged and a second control circuit region where the bit line selection switches are arranged, wherein the first control circuit region and the second control are alternately arranged in the row direction and the column direction.

* * * * *